(12) United States Patent
Fujimura et al.

(10) Patent No.: US 10,501,620 B2
(45) Date of Patent: Dec. 10, 2019

(54) CURABLE EPOXY COMPOSITION, FILM, LAMINATED FILM, PREPREG, LAMINATE, CURED ARTICLE, AND COMPOSITE ARTICLE

(71) Applicant: Intel Corporation, Santa Clara, CA (US)

(72) Inventors: Makoto Fujimura, Tokyo (JP); Yohei Tateishi, Tokyo (JP); Takeshi Sakano, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 14/780,758

(22) PCT Filed: Mar. 27, 2014

(86) PCT No.: PCT/JP2014/058735
§ 371 (c)(1),
(2) Date: Jan. 11, 2016

(87) PCT Pub. No.: WO2014/157446
PCT Pub. Date: Oct. 2, 2014

(65) Prior Publication Data
US 2016/0257812 A1 Sep. 8, 2016

(30) Foreign Application Priority Data

Mar. 29, 2013 (JP) ................................ 2013-074007

(51) Int. Cl.
| | |
|---|---|
| *C08L 63/08* | (2006.01) |
| *B32B 27/38* | (2006.01) |
| *C08J 5/24* | (2006.01) |
| *C08G 59/46* | (2006.01) |
| *H05K 1/03* | (2006.01) |
| *B32B 27/08* | (2006.01) |
| *B32B 27/12* | (2006.01) |
| *B32B 27/32* | (2006.01) |
| *B32B 27/36* | (2006.01) |
| *B32B 27/42* | (2006.01) |
| *C08G 59/56* | (2006.01) |
| *C08J 5/04* | (2006.01) |
| *D06M 15/55* | (2006.01) |
| *H05K 3/46* | (2006.01) |
| *D06M 101/00* | (2006.01) |

(52) U.S. Cl.
CPC ............. *C08L 63/08* (2013.01); *B32B 27/08* (2013.01); *B32B 27/12* (2013.01); *B32B 27/32* (2013.01); *B32B 27/36* (2013.01); *B32B 27/38* (2013.01); *B32B 27/42* (2013.01); *C08G 59/46* (2013.01); *C08G 59/56* (2013.01); *C08J 5/043* (2013.01); *C08J 5/24* (2013.01); *D06M 15/55* (2013.01); *H05K 1/0353* (2013.01); *B32B 2260/021* (2013.01); *B32B 2260/046* (2013.01); *B32B 2307/206* (2013.01); *B32B 2307/306* (2013.01); *B32B 2457/00* (2013.01); *C08J 2363/00* (2013.01); *C08J 2363/08* (2013.01); *C08L 2203/20* (2013.01); *C08L 2205/05* (2013.01); *D06M 2101/00* (2013.01); *H05K 3/4626* (2013.01); *H05K 3/4676* (2013.01)

(58) Field of Classification Search
CPC ........ B32B 27/08; B32B 27/12; B32B 27/32; B32B 27/36; B32B 27/38; B32B 27/42; C08G 59/46; C08G 59/56; C08J 5/043; C08J 5/24; D06M 15/55; H05K 1/0353
USPC ........................................................ 442/117
See application file for complete search history.

(56) References Cited

U.S. PATENT DOCUMENTS

| | | | |
|---|---|---|---|
| 2010/0056671 A1* | 3/2010 | Dershem ............ | C08G 59/3209 523/400 |
| 2011/0120761 A1 | 5/2011 | Kawai | |
| 2012/0175159 A1 | 7/2012 | Sakauchi et al. | |
| 2014/0295159 A1* | 10/2014 | Kawasaki .................. | C08J 5/18 428/216 |

FOREIGN PATENT DOCUMENTS

| | | |
|---|---|---|
| JP | 2006-278994 A | 10/2006 |
| JP | 2008-037957 A | 2/2008 |
| JP | 2009235165 A | 10/2009 |
| JP | 2011-132507 A | 7/2011 |
| JP | 2012-153885 A | 8/2012 |
| WO | 2013/27732 A1 | 2/2013 |
| WO | 2013/027732 A1 | 2/2013 |

OTHER PUBLICATIONS

International Search Report dated Apr. 22, 2014, issued in counterpart application No. PCT/JP2014/058735 (2 pages).
International Preliminary Report on Patentability dated Sep. 29, 2015, issued in counterpart International Patent Application No. PCT/JP2014/058735, (Form PCT/IB/373 and Form PCT/ISA/237). (6 pages).

* cited by examiner

*Primary Examiner* — Vincent Tatesure
(74) *Attorney, Agent, or Firm* — Womble Bond Dickinson (US) LLP

(57) ABSTRACT

A curable epoxy composition comprising an epoxy compound (A), active ester compound (B), and triazine structure-containing phenol resin (C), wherein the epoxy compound (A) includes a polyvalent epoxy compound (A-1) which has an alicyclic condensed polyvalent structure in a ratio of content of 30 wt % or more is provided.

21 Claims, No Drawings

CURABLE EPOXY COMPOSITION, FILM, LAMINATED FILM, PREPREG, LAMINATE, CURED ARTICLE, AND COMPOSITE ARTICLE

TECHNICAL FIELD

The present invention relates to a curable epoxy composition, film, laminated film, prepreg, laminate, cured article, and composite article.

BACKGROUND ART

Along with the pursuit of smaller sizes, increased functions, and faster communications in electronic equipment, further higher densities of the circuit boards which are used for the electronic equipment have been sought. To meet such demands for higher densities, circuit boards are being made multilayered. Such multilayer circuit boards are, for example, formed by taking an inside layer board which is comprised of an electrical insulating layer and a conductor layer which is formed on its surface, laminating an electrical insulating layer over it, forming a conductor layer over this electrical insulating layer, and further repeating this lamination of an electrical insulating layer and formation of a conductor layer.

As the material for forming the electrical insulating layer of such multilayer circuit boards, in general ceramics and thermosetting resins are being used. Among these, as thermosetting resins, epoxy resins are being widely used since they are excellent in the point of the balance of economy and performance.

As an epoxy resin material for forming an electrical insulating layer, for example, Patent Document 1 discloses an epoxy resin composition which contains (A) an epoxy resin, (B) an active ester compound, and (C) a triazine-containing cresol novolac resin. According to this composition, it is possible to form an insulating layer which exhibits a high bonding force to the plating conductor, regardless of the roughness being small, and is low in linear expansion rate and low in dielectric tangent.

In this regard, in the above multilayer circuit board, the conductor layers are connected with each other through via holes which are provided in the electrical insulating layers. In the formation of via holes, an electrical insulating layer is formed with a hole for via hole by laser processing, then metal plating, but before that, desmearing is performed to remove the resin residue (smears) which formed in the laser processing and remains on the lower conductor layer or electrical insulating layer. The desmearing is performed by, for example, dipping the multilayer board in which the hole for via hole are formed in a solution of a chemical oxidizing agent such as potassium permanganate or potassium dichromate to dissolve away the smears in the hole. If the desmearing ability is insufficient and the desmearing is not sufficiently secured, even if metal plating the via hole, the smears are liable to prevent conduction between the upper conductor layer and lower conductor layer from being sufficiently secured.

Further, in the multilayer circuit board, the conductor layer and the electrical insulating layer have to be closely bonded, but if the adhesion is weak, peeling may end up occurring during the process of fabrication or during the mounting of the multilayer circuit board and further during use as a board for an electronic material and reliability is liable to no longer be insufficiently secured.

PRIOR ART DOCUMENTS

Patent Documents

Patent Document 1: Japanese Patent Publication No. 2011-132507A (U.S. Patent Application Publication No. 2011/0120761)

SUMMARY OF THE INVENTION

Problem to be Solved by the Invention

Therefore, the present inventors engaged in studies and clarified that when using the above epoxy resin composition according to Patent Document 1 to form an electrical insulating layer of a multi layer printed circuit board, the heat resistance and the electrical characteristics are generally good, but the desmearing ability is inferior and the adhesion with the conductor layer is still insufficient.

An object of the present invention is to provide a curable epoxy composition which can form an electrical insulating layer which is excellent in heat resistance, electrical characteristics, and desmearing ability with a good balance and is excellent in adhesion with a conductor layer and solder heat resistance and a film, multilayer film, prepreg, laminate, cured article, and composite article which are obtained using this.

Means for Solving the Problems

The present inventors engaged in intensive research for achieving the above object and as a result discovered that according to a curable epoxy composition obtained by mixing a triazine structure-containing phenol resin into an epoxy compound which contains a polyvalent epoxy compound which has an alicyclic condensed polycyclic structure, an electrical insulating layer which has the desired characteristics can be obtained and thereby completed the present invention.

That is, according to the present invention, there are provided:

[1] A curable epoxy composition comprising an epoxy compound (A), active ester compound (B), and triazine structure-containing phenol resin (C), wherein the epoxy compound (A) includes a polyvalent epoxy compound (A-1) which has an alicyclic condensed polycyclic structure in a ratio of content of 30 wt % or more,

[2] The curable epoxy composition according to [1] wherein the epoxy compound (A) further includes an alicyclic epoxy compound (A-2),

[3] The curable epoxy composition according to [1] or [2] wherein the epoxy compound (A) is such that the content ratio of a bisphenol type epoxy compound is less than 30 wt %,

[4] The curable epoxy composition according to any one of [1] to [3], wherein a ratio of content of the triazine structure-containing phenol resin (C) with respect to the active ester compound (B) is less than 0.2 as a weight ratio [triazine structure-containing phenol resin (C)/active ester compound (B)],

[5] The curable epoxy composition according to any one of [1] to [4], wherein the polyvalent epoxy compound (A-1) which has an alicyclic condensed polycyclic structure is a phenol novolac type epoxy compound which has an alicyclic condensed polycyclic structure,

[6] The curable epoxy composition according to any one of [1] to [4], further comprising an alicyclic olefin polymer which contains an aromatic ring and/or hetero atom and does not have reactivity with an epoxy group,

[7] A film comprising the curable epoxy composition according to any one of [1] to [6],

[8] A laminated film having a binder layer which comprises the curable epoxy composition according to any one of [1] to [6] and a plateable layer which comprises a platable layer-use resin composition,

[9] The laminated film according to [8], wherein the plateable layer includes an alicyclic olefin polymer in 50 wt % or more,

[10] A prepreg comprising the film according to [7] or the laminated film according to [8] or [9] and a fiber base material,

[11] A laminate obtained by laminating a substrate with the film according to [7], the laminated film according to [8] or [9], or the prepreg according to [10],

[12] A cured article obtained by curing the curable epoxy composition according to any one of [1] to [6], the film according to [7], the laminated film according to [8] or [9], the prepreg according to [10], or the laminate according to [11],

[13] A composite article obtained by forming a conductor layer on a surface of the cured product according to [12], and

[14] A board for an electronic material comprising the cured article according to [12] or the composite article according to [13].

Effects of the Invention

According to the present invention, there are provided a curable epoxy composition which can form an electrical insulating layer which is excellent in heat resistance, electrical characteristics, and desmearing ability with a good balance and is excellent in adhesion with a conductor layer and solder heat resistance and a film, multilayer film, prepreg, laminate, cured product, and composite article which are obtained using this.

DESCRIPTION OF EMBODIMENTS

The curable epoxy composition of the present invention is a composition which contains an epoxy compound (A), active ester compound (B), and triazine structure-containing phenol resin (C), in which the epoxy compound (A) includes a polyvalent epoxy compound (A-1) which has an alicyclic condensed polycyclic structure in a ratio of content of 30 wt % or more.

The curable epoxy composition of the present invention has as one large feature comprising an epoxy compound (A) which contains a predetermined amount of a polyvalent epoxy compound (A-1) which has an alicyclic condensed polycyclic structure to which a triazine structure-containing phenol resin (C) is mixed. When making the polyvalent epoxy compound (A-1) cure by an active ester compound (B) which acts as a curing agent, the electrical insulating layer which is comprised of the obtained cured resin has excellent heat resistance, electrical characteristics, and desmearing ability, but in the present invention, together with a polyvalent epoxy compound (A-1), further a triazine structure-containing phenol resin (C) is used. Therefore the electrical insulating layer maintains the above property while further being excellent in adhesion with a conductor layer laminated on the electrical insulating layer and in solder heat resistance.

Below, the present invention will be explained in detail. Note that, in this Description, a polyvalent epoxy compound (A-1) which has an alicyclic condensed polycyclic structure will sometimes be abbreviated as a "polyvalent epoxy compound (A-1)".

[Epoxy Compound (A)]

The epoxy compound (A) used in the present invention includes a polyvalent epoxy compound (A-1) in a ratio of content of 30 wt % or more.

[Polyvalent Epoxy Compound (A-1)]

The polyvalent epoxy compound (A-1) used in the present invention is a compound which has at least two epoxy groups (oxirane rings) in a molecule and which has at least one alicyclic condensed polycyclic structure. Among these, one which has an alicyclic condensed polycyclic structure and which has at least two glycidyl ether structures in a molecule is preferable. As an epoxy compound which has an alicyclic condensed polycyclic structure and which has at least two glycidyl ether structures in a molecule, a phenol novolac type epoxy compound which has an alicyclic condensed polycyclic structure is preferable from the viewpoint of the heat resistance and electrical characteristics.

The "alicyclic condensed polycyclic structure" means a structure comprised of two or more alicyclic monocyclic structures condensed. The alicyclic structures forming these structures may be ones including a hetero atom. The number of condensed cyclic structures is not particularly limited, but from the viewpoint of raising the heat resistance or mechanical strength of the obtained electrical insulating layer, two or more cyclic structures are preferable. Practically, the upper limit is 10 cyclic structures or so. As this alicyclic condensed polycyclic structure, for example, a norbornane structure, norbornene structure, norbornadiene structure, dicyclopentadiene structure, adamantane structure, etc. may be mentioned, while a dicyclopentadiene structure is preferable. As the polyvalent epoxy compound (A-1) which has a dicyclopentadiene structure, among these as well, a compound of the following general formula (I) is particularly preferable.

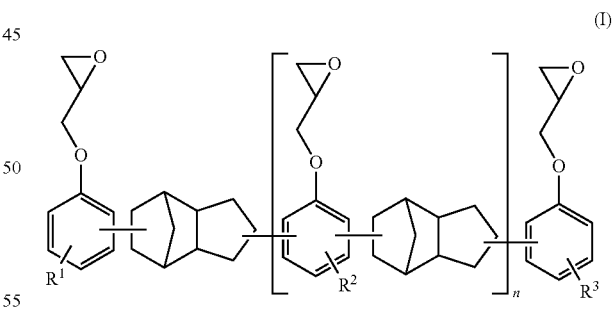

(I)

(wherein, $R^1$, $R^2$, and $R^3$ respectively independently indicate a hydrogen atom or $C_1$ to $C_{12}$ alkyl group, and "n" indicates an integer of 0 to 50. When "n" is 2 or more, the plurality of $R^2$ may be the same or different)

Note that, the alicyclic condensed polycyclic structure usually form part of the mainchain of the resin, but may also be present at the side chain.

As the polyvalent epoxy compound (A-1), since an excellent curing reactivity is obtained, the epoxy equivalents are usually 100 to 1500 equivalents, preferably 150 to 500 equivalents.

Note that, in this Description, "epoxy equivalent" is the number of grams of an epoxy compound which includes 1 gram equivalent of epoxy groups (g/eq) and can be measured in accordance with the method of JIS K 7236

The polyvalent epoxy compound (A-1) used in the present invention can be suitably produced in accordance with a known method, but can also be obtained as a commercially available product.

As an example of a commercially available product of a polyvalent epoxy compound (A-1), a phenol novolac type epoxy compound which has a dicyclopentadiene structure, for example, product name "Epiclon HP7200L, Epiclon HP7200, Epiclon HP7200H, Epiclon HP7200HH, Epiclon HP7200HHH" (above made by DIC, "Epiclon" is a registered trademark), product name "Tactix558" (made by Huntsman Advanced Material, "Tactix" is a registered trademark), product names "XD-1000-1L, XD-1000-2L" (above, made by Nippon Kayaku) etc. may be mentioned.

The polyvalent epoxy compound (A-1) may be used alone or as two types or more mixed together.

[Alicyclic Epoxy Compound (A-2)]

The epoxy compound (A) used in the present invention preferably further contains an alicyclic epoxy compound (A-2) from the viewpoint of further improvement of the desmearing ability in the obtained electrical insulating layer.

The "alicyclic epoxy compound (A-2)" is a compound which has at least one epoxycycloalkyl group which is shown in the following general formula (II) in a molecule.

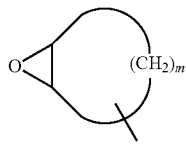

(II)

(wherein, "m" is an integer of 2 to 10)

As the alicyclic epoxy compound (A-2), in particular, a compound which has an epoxycyclopentyl group (one where, in the above general formula (II), m=3) or an epoxycyclohexyl group (one where, in the above general formula (II), m=4] is preferable. Further, from the viewpoint of raising the curing reactivity and improving the heat resistance of the obtained electrical insulating layer, an alicyclic polyvalent epoxy compound which has two or more epoxycycloalkyl groups in a molecule is suitable (upper limit is about 10 from practical viewpoint).

As the alicyclic epoxy compound (A-2), due to giving an excellent curing reactivity, so the epoxy equivalent is usually 100 to 1500 equivalents, preferably 150 to 500 equivalents.

The alicyclic epoxy compound (A-2) can be obtained in accordance with a known method by causing a compound which has at least one cycloalkenyl group to react with m-chloroperbenzoic acid, peracetic acid, hydrogen peroxide, or other peroxides or oxygen or other epoxylating agents, but can also be obtained as a commercial available product. As an example of the commercial available product, product name "Celloxide 2021P, Celloxide 2081, Celloxide 2000, Epolead GT401" (above, made by Daicel Chemical Industry, "Celloxide" and "Epolead" are registered trademarks), etc. may be mentioned.

The above alicyclic epoxy compounds (A-2) may be used alone or as two types or more mixed together.

(Bisphenol Type Epoxy Compound)

In the present invention, the epoxy compound which is used as the epoxy compound (A) is not particularly limited except for including the polyvalent epoxy compound (A-1) in 30 wt % or more, but from the viewpoint of realizing excellent desmearing ability of the obtained electrical insulating layer, the ratio of content of the bisphenol type epoxy compound in the epoxy compound (A) is preferably less than 30 wt %, more preferably less than 10 wt %, furthermore preferably 0 wt % (that is, the curable epoxy composition of the present invention furthermore preferably does not contain any bisphenol type epoxy compound at all).

In this Description, "bisphenol type epoxy compound" is the general term for epoxy compounds which are obtained by a reaction of bisphenol and epihalohydrin. There are various types of bisphenol type epoxy compounds depending on the structure of the raw material bisphenol. "Bisphenol" is a compound where two hydroxyphenyl groups are bonded at the p-positions through divalent groups. As examples of the divalent groups, a sulfonyl group, sulfil group, divalent organic group, for example, a $C_1$ to $C_6$ linear or branched alkylene group, $C_3$ to $C_6$ divalent alicyclic hydrocarbon group, phenylene group, phenylene dialkylidene group, etc. may be mentioned. The divalent organic groups may be substituted by halogen or phenyl group etc. As specific examples of the bisphenol, bisphenol A, bisphenol F, bisphenol AF, bisphenol S, bisphenol M, bisphenol E, bisphenol P, bisphenol AP, bisphenol Z, etc. may be mentioned.

The type of the bisphenol type epoxy compound is not particularly limited, but from the viewpoint of realizing well the desmearing ability of the obtained electrical insulating layer, the epoxy compound (A) preferably does not contain one or more types selected from the group comprising a bisphenol A type epoxy resin, bisphenol F type epoxy compound, bisphenol AF type epoxy compound, bisphenol S type epoxy compound, bisphenol M type epoxy compound, bisphenol E type epoxy compound, bisphenol P type epoxy compound, bisphenol AP type epoxy compound, and bisphenol Z type epoxy compound in a ratio of content of 30 wt % or more (that is, it is preferable that the ratio of content of these in the epoxy compound (A) is made less than 30 wt %.).

(Other Epoxy Compounds)

The curable epoxy composition of the present invention may suitably contain, as an epoxy compound (A), other epoxy compounds besides the above epoxy compounds. These other epoxy compounds are not particularly limited, but, for example, a cresol novolac type epoxy compound, phenol novolac type epoxy compound, aliphatic chain epoxy compound, glycidyl ester type epoxy compound, glycidyl amine type epoxy compound, biphenyl type epoxy compound, and epoxy-modified rubber etc. may be mentioned. These may be suitably obtained as commercially available products.

In the curable epoxy composition of the present invention, the ratio of content of the polyvalent epoxy compound (A-1) in the epoxy compound (A) is 30 wt % or more, preferably 40 wt % or more, more preferably 50 wt % or more. The upper limit is usually 95 wt %. If the ratio of content of the polyvalent epoxy compound (A-1) is less than 30 wt %, the desired heat resistance, electrical characteristics, and desmearing ability cannot be obtained in the obtained electrical insulating layer. The ratio of content of the epoxy compounds which is used as the epoxy compound (A) other than the polyvalent epoxy compound (A-1) is not particularly limited, but the ratio of content of the alicyclic epoxy compound (A-2) is usually 10 to 75 wt %, preferably 20 to 65 wt %, from the viewpoint of further improving the desmearing ability in the obtained electrical insulating layer. From the viewpoint of realizing well the effects of the present invention, the ratio of content of the bisphenol type epoxy compound in the epoxy compound (A) is as explained above, while the ratio of content of the other epoxy compounds is usually suitably 40 wt % or less. In the curable epoxy composition of the present invention, the above-mentioned various epoxy compounds used as the epoxy compound (A) are used so that their ratios of content in the epoxy compound (A) total 100 wt %.

[Active Ester Compound (B)]

The active ester compound (B) used in the present invention may be one which has active ester groups, but in the present invention, a compound which has at least two active ester groups in its molecule is preferable. The active ester compound (B) acts as a curing agent for the epoxy compound (A) used in the present invention.

As the active ester compound (B), from the viewpoints of raising the heat resistance of the obtained electrical insulating layer etc., an active ester compound which is obtained by reacting a carboxylic acid compound and a hydroxy compound is preferable, an active ester compound which is obtained by reacting a carboxylic acid compound and one or more compounds selected from the group comprised of a phenol compound and naphthol compound is more preferable, and an aromatic compound which is obtained by reacting a carboxylic acid compound and an aromatic compound having a phenolic hydroxyl group and which has at least two active ester groups in a molecule is particularly preferable. The active ester compound (B) may be a linear one or multibranched one. If illustrating the case where the active ester compound (B) is derived from a compound which has at least two carboxylic acids in its molecule, when such a compound which has at least two carboxylic acids in its molecule contains an aliphatic chain, it is possible to raise the compatibility with the epoxy resin, while when it has an aromatic ring, it is possible to raise the heat resistance.

As specific examples of the carboxylic acid compound for forming an active ester compound (B), benzoic acid, acetic acid, succinic acid, maleic acid, itaconic acid, phthalic acid, isophthalic acid, terephthalic acid, pyromellitic acid, etc. may be mentioned. Among these as well, from the viewpoint of raising the heat resistance of the obtained electrical insulating layer, succinic acid, maleic acid, itaconic acid, phthalic acid, isophthalic acid, and terephthalic acid are preferable, phthalic acid, isophthalic acid, and terephthalic acid are particularly preferable, and isophthalic acid and terephthalic acid are furthermore preferable.

As specific examples of the hydroxy compound for forming the active ester compound (B), hydroquinone, resorcine, bisphenol A, bisphenol F, bisphenol S, phenol phthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, fluoroglycine, benzenetriol, dicyclopentadienyl diphenol, phenol novolac, etc. may be mentioned. Among these as well, from the viewpoints of improving the solubility of the active ester compound (B) and raising the heat resistance of the obtained electrical insulating layer, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol, and phenol novolac are preferable, dihydroxybenzophenone, trihydroxybenzophenone, tetrahydroxybenzophenone, dicyclopentadienyl diphenol, and phenol novolac are more preferable, and diyclopentadienyl diphenol and phenol novolac are furthermore preferable.

The method of production of the active ester compound (B) is not particularly limited. It may be produced by a known method. For example, it may be obtained by a condensation reaction between the carboxylic acid compound and hydroxy compound.

In the present invention, as the active ester compound (C), for example, an aromatic compound which has an active ester group disclosed in Japanese Patent Publication No. 2002-12650A or a polyfunctional polyester disclosed in Japanese Patent Publication No. 2004-277460A or a commercially available product may be used. As the commercially available product, for example, product names "EXB9451, EXB9460, EXB9460S, Epiclon HPC-8000-65T" (above, made by DIC, "Epiclon" is a registered trademark), product name "DC808" (made by Japan Epoxy Resin), product name "YLH1026" (made by Japan Epoxy Resin), etc. may be mentioned.

In the curable epoxy composition of the present invention, the amount of the active ester compound (B) is preferably 20 to 140 parts by weight with respect to the 100 parts by weight of total of the epoxy compounds forming the epoxy compound (A), more preferably 40 to 125 parts by weight, furthermore preferably 60 to 110 parts by weight in range. Further, the equivalent ratio, in the curable epoxy composition, of the epoxy compound (A) and active ester compound (B) (ratio of total number of epoxy groups of epoxy compounds forming epoxy compound (A) with respect to total number of active ester groups of active ester compound (B) (amount of epoxy groups/amount of active ester groups)) is usually less than 1, preferably 0.6 to 0.99, more preferably 0.65 to 0.95 in range. By making the amount of the active ester compound (B) in the above range, the obtained electrical insulating layer can be improved in heat resistance and electrical characteristics and the heat expansion coefficient of the obtained electrical insulating layer can be kept small. Note that, the equivalent ratio of the epoxy compound (A) and active ester compound (B) can be found from the total epoxy equivalents of the epoxy compound (A) and the total active ester equivalents of the active ester compound (B).

[Triazine Structure-Containing Phenol Resin (C)]

The triazine structure-containing phenol resin (C) used in the present invention is a condensation polymer of phenol, cresol, naphthol, or other aromatic hydroxy compound, melamine, benzoguanamine, or other compound having a triazine ring, and formaldehyde. The triazine structure-containing phenol resin (C) typically has a structure of the following general formula (III).

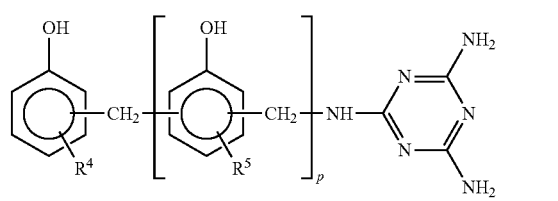

(wherein, $R^4$ and $R^5$ are respectively independently a hydrogen atom or methyl group and "p" is an integer of 1 to 30. If "p" is 2 or more, the plurality of $R^5$ may be the same or different. Further, in formula (III), for at least one amino group, the hydrogen atom which is contained in the amino group may be substituted by another group (for example, alkyl group etc.))

The triazine structure-containing phenol resin (C), like the active ester compound (B), can act as a curing agent due to the presence of the phenolic active hydroxyl groups, and by the curable epoxy composition of the present invention including a triazine structure-containing phenol resin (C), the obtained electrical insulating layer exhibits excellent adhesion with a conductor layer on which that layer is laminated, in particular a conductor layer comprised of copper.

The triazine structure-containing phenol resin (C) can be produced in accordance with a known method, but may also be obtained as a commercially available product. As examples of such commercially available products, product names "LA7052, LA7054, LA3018, and LA1356" (above, made by DIC) etc. may be mentioned.

The above triazine structure-containing phenol resins (C) may be used alone or as two types or more mixed together.

In the curable epoxy composition of the present invention, from the viewpoint of realizing well the electrical characteristics, desmearing ability, and adhesion with the conductor layer in the obtained electrical insulating layer, the amount of the triazine structure-containing phenol resin (C) preferably is one which satisfies a weight ratio of a ratio of content of the triazine structure-containing phenol resin (C) with respect to the active ester compound (B) (triazine structure-containing phenol resin (C)/active ester compound (B)) of less than 0.2, more preferably satisfies 0.15 or less. The lower limit is usually 0.01.

Further, in the curable epoxy composition of the present invention, the equivalent ratio of the epoxy compound (A) and the active ester compound (B) and triazine structure-containing phenol resin (C) (ratio of total number of epoxy groups of epoxy compounds forming epoxy compound (A) with respect to total number of active ester groups of active ester compound (B) and active hydroxyl groups of triazine structure-containing phenol resin (C) (amount of epoxy groups/(amount of active ester groups+amount of active hydroxyl groups))) is usually less than 1, preferably 0.6 to 0.99, more preferably 0.65 to 0.95 in range. By making the above equivalent ratio in the above range, it is possible to realize well the electrical characteristics and desmearing ability in the obtained electrical insulating layer. Note that, the equivalent ratio of the epoxy compound (A) and the active ester compound (B) and triazine structure-containing phenol resin (C) can be found from the total epoxy equivalent of the epoxy compound (A) and the total active ester equivalent of the active ester compound (B) and total active hydroxyl group equivalent of the triazine structure-containing phenol resin (C).

(Other Ingredients)

The curable epoxy composition of the present invention may further suitably contain, to an extent not interfering with the expression of the effect of the present invention, other ingredients such as described below other than the polyvalent epoxy compound (A), active ester compound (B), and triazine structure-containing phenol resin (C).

By mixing a filler into the curable epoxy composition of the present invention, it is possible to make the obtained cured resin low in linear expansion. As that filler, either of a known inorganic filler and organic filler can be used, but an inorganic filler is preferable. As specific examples of an inorganic filler, calcium carbonate, magnesium carbonate, barium carbonate, zinc oxide, titanium oxide, magnesium oxide, magnesium silicate, calcium silicate, zirconium silicate, hydrated alumina, magnesium hydroxide, aluminum hydroxide, barium sulfate, silica, talc, clay, etc. may be mentioned. Among these, from the view point of raising the heat resistance and electrical characteristics, silica is preferable. Note that, the filler used may be surface treated in advance by a silane coupling agent etc.

The content of the filler in the curable epoxy composition of the present invention is not particularly limited, but converted to solid content is usually 30 to 90 wt %, preferably 50 to 85 wt %, more preferably 60 to 80 wt %.

Further, by mixing, into the curable epoxy composition of the present invention, an alicyclic olefin polymer which contains aromatic rings and/or hetero atoms and not having reactivity to an epoxy group, it is possible to improve the flexibility of the later explained film or laminate film which is obtained by using the composition and improve the handling ability without lowering the storage stability of the composition. This alicyclic olefin polymer is one which does not have reactivity with respect to an epoxy group, so therefore substantially does not contain any functional group which has reactivity to an epoxy group. Here, "substantially does not contain any functional group which has reactivity to an epoxy group" means the alicyclic olefin polymer does not contain any functional group which has reactivity with respect to an epoxy group to an extent where expression of the effect of the present invention is obstructed. As a functional group which has reactivity with an epoxy group, a group which has a structure which can react with an epoxy group to form a covalent bond may be mentioned, for example, a primary amino group, secondary amino group, mercapto group, carboxyl group, carboxylic acid anhydride group, hydroxyl group, and epoxy group and other hetero atom-containing functional group which reacts with an epoxy group to form a covalent bond may be mentioned.

The above alicyclic olefin polymer can, for example, be easily obtained by suitably combining and polymerizing, in accordance with a known method, an alicyclic olefin monomer (a) which does not contain a hetero atom but contains an aromatic ring, an alicyclic olefin monomer (b) which does not contain an aromatic ring but contains a hetero atom, an alicyclic olefin monomer (c) which contains both an aromatic ring and hetero atom, and a monomer (d) which does not contain either an aromatic ring and hetero atom and can copolymerize with the alicyclic olefin monomers (a) to (c). The obtained polymer may be further hydrogenated.

As specific examples of the alicyclic olefin monomer (a), 5-phenyl-bicyclo[2.2.1]hept-2-ene, 1,4-methano-1,4,4a,5, 10,10a-hexahydroanthracene, tetracyclo[6.5.0.1$^{2,5}$.0$^{8,13}$]trideca-3,8,10,12-tetraene (also referred to as "1,4-methano-1, 4,4a,9a-tetrahydrofluorene", below, abbreviated as "MTF"), tetracyclo[6.6.0.1$^{2,5}$.1$^{8,13}$]tetradeca-3, 8,10,12-tetraene (also referred to as "1,4-methano-1,4,4a,5,10,10a-hexahydroanthracene"), 8-phenyl-tetracyclo[4.4.0.1$^{2,5}$.1$^{7,10}$]dodec-3-ene, etc. may be mentioned.

As specific examples of the alicyclic olefin monomer (b), 8-methyl-8-methoxycarbonyltetracyclo[4.4.0.1$^{2,5}$.1$^{7,10}$]dodec-3-ene, 5-methoxy-carbonyl-bicyclo[2.2.1]hept-2-ene, 5-cyano-bicyclo[2.2.1]hept-2-ene, 5-methyl-5-methoxycarbonyl-bicyclo[2.2.1]hept-2-ene; 5-methoxycarbonylbicyclo[2.2.1]hept-2-ene, 5-ethoxycarbonylbicyclo[2.2.1]hept-2-ene, 5-methyl-5-methoxycarbonylbicyclo[2.2.1]hept-2-ene, 5-methyl-5-ethoxycarbonylbicyclo[2.2.1]hept-2-ene, bicyclo[2.2.1]hept-5-enyl-2-methylpropionate, bicyclo[2.2.1]hept-5-enyl-2-methyloctanate; 5-cyanobicyclo[2.2.1]hept-2-ene, N-methylbicyclo[2.2.1]hept-2-ene-5,6-dicarboxylic acid imide, N-(2-ethylhexyl)bicyclo[2.2.1]hept-2-ene-5,6-dicarboxylic acid imide (below, abbreviated as "NEHI"), 8-methoxycarbonyltetracyclo[4.4.1$^{2,5}$.1$^{7,10}$.0]-dodec-3-ene, 8-methyl-8-methoxycarbonyltetracyclo[4.4.1$^{2,5}$.1$^{7,10}$.0]-dodec-3-ene, bicyclo[2.2.1]hept-2-ene-5,6-dicarboxylic acid anhydride (below, abbreviated as "ND2A") etc. may be mentioned.

As specific examples of the alicyclic olefin monomer (c), N-(4-phenyl)-(5-norbornene-2,3-dicarboxyimide) (below, abbreviated as "NBPI"), N-(4-methylphenyl)-(5-norbornene-2,3-dicarboxyimide), 2-(4-methoxyphenyl)-5-norbornene, 2-benzyloxycarbonyl-5-norbornene, etc. may be mentioned.

As specific examples of the alicyclic olefin monomer (d), bicyclo[2.2.1]hept-2-ene (common name: norbornene), 5-ethylidene-bicyclo[2.2.1]hept-2-ene (below, abbreviated as "EdNB"), or other norbornenes; tricyclo[4.3.0.1$^{2,5}$]deca-3,7-diene (common name: dicyclopentadiene), or other dicyclopentadienes; tetracyclo[4.4.0.1$^{2,5}$.1$^{7,10}$]dodec-3-ene (common name: tetracyclododecene, below abbreviated as "TCD"), or other tetracyclododecenes; ethylene, propylene, or other α-olefins having 2 to 20 carbon atoms; 1,4-hexadiene, or other nonconjugated dienes etc. may be mentioned.

In the curable epoxy composition of the present invention, the content of the alicyclic olefin polymer which contains an aromatic ring and/or hetero atom and does not have reactivity with respect to an epoxy group is not particularly limited, but it is usually 1 to 50 parts by weight with respect to a total 100 parts by weight of the epoxy compounds which constitute the epoxy compound (A), preferably 2 to 35 parts by weight.

The curable epoxy composition of the present invention may, as desired, contain a curing accelerator. The curing accelerator is not particularly limited, but, for example, an aliphatic polyamine, aromatic polyamine, secondary amine, tertiary amine, acid anhydride, imidazole derivative, organic acid hydrazide, dicyan diamide, and their derivatives, urea derivatives, etc. may be mentioned. Among these as well, an imidazole derivative is particularly preferable.

The imidazole derivative is not particularly limited so long as a compound which has an imidazole structure, but, for example, 2-ethyl imidazole, 2-ethyl-4-methyl imidazole, bis-2-ethyl-4-methyl imidazole, 1-methyl-2-ethyl imidazole, 2-isopropyl imidazole, 2,4-dimethyl imidazole, 2-heptadecylimidazole, or other alkyl-substituted imidazole compounds; 2-phenyl imidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl) imidazole, or other imidazole compounds which are substituted by aryl groups, aralkyl groups or other hydrocarbon groups which contain cyclic structures etc. may be mentioned. These may be used alone or as two or more types combined.

In the curable epoxy composition of the present invention, the amount of the curing accelerator is usually 0.1 to 10 parts by weight with respect to the total 100 parts by weight of the epoxy compounds which constitute the epoxy compound (A), preferably 0.5 to 8 parts by weight.

Furthermore, the curable epoxy composition of the present invention may suitably have mixed into it, for the purpose of improving the flame retardance of the electrical insulating layer obtained, for example a halogen-based flame retardant, phosphoric acid ester-based flame retardant, or other flame retardant which is mixed into general resin compositions for forming an electrical insulating film.

The curable epoxy composition of the present invention may suitably further contain, as desired, a flame retardant aid, heat resistance stabilizer, weather resistance stabilizer, antiaging agent, ultraviolet absorber (laser processability improving agent), leveling agent, antistatic agent, slip agent, antiblocking agent, anticlouding agent, lubricant, dye, natural oil, synthetic oil, wax, emulsion, magnetic substance, dielectric characteristic adjuster, toughness agent, or other known ingredients.

The method of production of the curable epoxy composition of the present invention is not particularly limited. The above ingredients may be mixed in as they are or may be mixed in the state dissolved or dispersed in an organic solvent. Part of the above ingredients may be dissolved or dispersed in an organic solvent to prepare a composition and the remaining ingredients mixed with that composition.

(Film)

The film of the present invention is a shaped article obtained by forming the above-mentioned curable epoxy composition of the present invention into a sheet shape or film shape.

When forming the curable epoxy composition of the present invention into a sheet shape or film shape to obtain a shaped article, it is preferable to obtain it by coating, spraying, or casting the curable epoxy composition of the present invention while, in accordance with need, adding an organic solvent, then drying.

As the support which is used at this time, a resin film or metal foil etc. may be mentioned. As the resin film, a polyethylene terephthalate film, polypropylene film, polyethylene film, polycarbonate film, polyethylene naphthalate film, polyacrylate film, nylon film, etc. may be mentioned. Among these films, due to the excellent heat resistance, chemical resistance, peelability, etc., a polyethylene terephthalate film or polyethylene naphthalate film is preferable. As the metal foil, a copper foil, aluminum foil, nickel foil, chromium foil, gold foil, silver foil, etc. may be mentioned.

The thickness of the sheet shape or film shape shaped article is not particularly limited, but from the viewpoint of the work efficiency etc., it is usually 1 to 150 μm, preferably 2 to 100 μm, more preferably 5 to 80 μm.

As the method of coating the curable epoxy composition of the present invention, dip coating, roll coating, curtain coating, die coating, slit coating, gravure coating, etc. may be mentioned.

Note that, in the present invention, as the sheet shape or film shape shaped article, the curable epoxy composition of the present invention is preferably in an uncured or semicured state. Here, "uncured" means the state where when dipping a shaped article in a solvent which is able to dissolve the epoxy compounds which constitute the epoxy compound (A), substantially all of the epoxy compound are dissolved. Further, "semicured" means the state of being partially cured to an extent enabling further curing upon heating, preferably a state where parts of the epoxy compounds which are used for preparation of the composition (specifically, amounts of 7 wt % or more and amounts where parts remain) is dissolved in a solvent able to dissolve the epoxy compound or a state where the volume after dipping the shaped article in the solvent for 24 hours is 200% or more of the volume before dipping (swelling rate).

Further, the curable epoxy composition of the present invention may be coated on a support, then dried if desired. The drying temperature is preferably made a temperature of an extent whereby the curable epoxy composition of the present invention does not cure. It is usually 20 to 300° C., preferably 30 to 200° C. If the drying temperature is too high, the curing reaction proceeds too much and the obtained shaped article is liable to no longer become the uncured or semicured state. Further, the drying time is usually 30 seconds to 1 hour, preferably 1 minute to 30 minutes.

The thus obtained film of the present invention is used in a state adhered to the support or peeled off from the support.

(Laminated Film)

The laminated film of the present invention has an adhesive layer which is comprised of the above-mentioned curable epoxy composition and a platable layer which is comprised of a platable layer-use resin composition.

The platable layer is not particularly limited, but from the viewpoint of improving the laminated film in electrical characteristics and heat resistance, one where at least 50 wt % of the resin comprising that layer is comprised of an alicyclic olefin polymer is preferable. As a platable layer-use resin composition for forming such a platable layer, usually an alicyclic olefin polymer which has a polar group and one which contains a curing agent is preferable.

The alicyclic olefin polymer which has a polar group is not particularly limited. One which has an alicyclic structure constituted by a cycloalkane structure or cycloalkene structure etc. may be mentioned. But due to superior in the mechanical strength, heat resistance, etc., one which has a cycloalkane structure is preferable. Further, as the polar group which is contained in the alicyclic olefin polymer, an alcoholic hydroxyl group, phenolic hydroxyl group, carboxyl group, alkoxyl group, epoxy group, glycidyl group, oxycarbonyl group, carbonyl group, amino group, carboxylic anhydride group, sulfonic group, phosphoric group, etc. may be mentioned. Among these as well, a carboxyl group, carboxylic anhydride group, and phenolic hydroxyl group are preferable, while a carboxylic anhydride group is more preferable.

The curing agent which is included in the platable layer-use resin composition is not particularly limited so long as one which can form a cross-linked structure in the alicyclic olefin polymer which has a polar group by heating. It is possible to use a curing agent which is mixed in a resin composition for use in forming a general electrical insulating film. As the curing agent, it is preferable to use a compound which has two or more functional groups which can form bonds by reaction with the polar groups of the used alicyclic olefin polymer which has a polar group.

For example, as the curing agent which is suitably used when using an alicyclic olefin polymer which has a carboxyl group, carboxylic anhydride group, or phenolic hydroxy group as the alicyclic olefin polymer which has a polar group, a polyepoxy compound, polyisocyanate compound, polyamine compound, polyhydrazide compound, aziridine compound, basic metal oxides, organometallic halide, etc. may be mentioned. These may be used alone or may be used in two or more types. Further, it is also possible to jointly use these compounds and peroxides as a curing agent.

Among these, as a curing agent, since the reactivity with the polar groups of the alicyclic olefin polymer which has a polar group is moderate and the handling of the platable layer-use resin composition becomes easy, a polyvalent epoxy compound is preferable. A glycidyl ether type epoxy compound or alicyclic polyvalent epoxy compound is particularly preferably used.

In the platable layer-use resin composition, the amount of the curing agent is preferably 1 to 100 parts by weight with respect to 100 parts by weight of the alicyclic olefin polymer which has a polar group, more preferably 5 to 80 parts by weight, furthermore preferably 10 to 50 parts by weight. By making the amount of the curing agent in the above range, the mechanical strength and electrical characteristics of the cured product which is obtained by curing the laminated film of the present invention can be improved.

Further, the platable layer-use resin composition used in the present invention may contain, in addition to the above ingredients, a hindered phenol compound or hindered amine compound.

The hindered phenol compound is a phenol compound which has at least one hindered structure which has a hydroxyl group and which does not have a hydrogen atom at the carbon atom of the β-position of the hydroxyl group in its molecule. As specific examples of the hindered phenol compound, 1,1,3-tris-(2-methyl-4-hydroxy-5-tert-butylphenyl)butane, 4,4'-butylidenebis-(3-methyl-6-tert-butylphenol), 2,2-thiobis(4-methyl-6-tert-butylphenol), n-octadecyl-3-(4'-hydroxy-3',5'-di-tert-butylphenyl)propionate, tetrakis-[methylene-3-(3',5'-di-tert-butyl-4'-hydroxyphenyl) propionate]methane, etc. may be mentioned.

The content of the hindered phenol compound in the platable layer-use resin composition is not particularly limited, but is preferably 0.04 to 10 parts by weight with respect to 100 parts by weight of the alicyclic olefin polymer which has a polar group, more preferably 0.3 to 5 parts by weight, furthermore preferably 0.5 to 3 parts by weight. By making the amount of the hindered phenol compound in the above range, it is possible to improve the mechanical strength of the cured product which is obtained by curing the laminated film of the present invention.

Further, the hindered amine compound is a compound which has at least one 2,2,6,6-tetraalkylpiperidine group which has a secondary amine or tertiary amine at the 4-position in its molecule. The number of carbons of the alkyl is usually 1 to 50. As the hindered amine compound, a compound which has at least one 2,2,6,6-tetramethylpiperidyl group which has a secondary amine or tertiary amine at the 4-position in its molecule is preferable. Note that, in the present invention, it is preferable to use both the hindered phenol compound and the hindered amine compound. By using these together, when treating the cured article which is obtained by curing a laminated film of the present invention to roughen its surface by using an aqueous solution of permanganate etc., even when the surface roughening treatment conditions change, it becomes possible to keep the cured article after surface roughening treatment as one low in surface roughness.

As specific examples of the hindered amine compound, bis(2,2,6,6-tetramethyl-4-piperidyl) sebacate, bis(1,2,2,6,6-pentamethyl-4-piperidyl) sebacate, 1-[2-{3-(3,5-di-tert-butyl-4-hydroxyphenyl)propionyloxy}ethyl]-4-{3-(3,5-di-tert-butyl-4-hydroxyphenyl)propionyloxy}-2,2,6,6-tetramethylpiperidine, 8-benzyl-7,7,9,9-tetramethyl-3-octyl-1,2,3-triazaspiro[4,5]undecane-2,4-dione, etc. may be mentioned.

The amount of the hindered amine compound is not particularly limited, but is usually 0.02 to 10 parts by weight with respect to 100 parts by weight of the alicyclic olefin polymer which has a polar group, preferably 0.2 to 5 parts by weight, more preferably 0.25 to 3 parts by weight. By making the amount of the hindered amine compound in the above range, it is possible to improve the mechanical strength of the cured product which is obtained by curing the laminated film of the present invention.

Further, the platable layer-use resin composition used in the present invention may contain a curing accelerator in addition to the above ingredients. As the curing accelerator, a curing accelerator which is mixed into a general resin composition for electrical insulating film forming use may be used, but, for example, a curing accelerator similar to the above-mentioned curable epoxy composition of the present invention may be used. The amount of the curing accelerator in the platable layer-use resin composition may be suitably selected in accordance with the purpose of use, but is preferably 0.001 to 30 parts by weight with respect to 100 parts by weight of the alicyclic olefin polymer which has a polar group, more preferably 0.01 to 10 parts by weight, furthermore preferably 0.03 to 5 parts by weight.

Furthermore, the platable layer-use resin composition used in the present invention may contain a filler in addition to the above ingredients. As the filler, one similar to the filler which is used for the above-mentioned curable epoxy composition can be used. In the platable layer-use resin composition, the amount of the filler, converted to solid content, is usually 1 to 50 wt %, preferably 2 to 45 wt %, more preferably 3 to 35 wt %.

Further, the platable layer-use resin composition used in the present invention may suitably further contain, in addition to the above ingredients, in the same way as the above-mentioned curable epoxy composition of the present invention, a curing accelerator, flame retardant, flame retardant aid, heat resistance stabilizer, weather resistance stabilizer, antiaging agent, ultraviolet absorber (laser processability improving agent), leveling agent, antistatic agent, slip agent, antiblocking agent, anticlouding agent, lubricant, dye, natural oil, synthetic oil, wax, emulsion, magnetic substance, dielectric characteristic adjuster, toughness agent, or other known ingredients. The ratio of mixture of these optional ingredients may be suitably selected in a range not detracting from the object of the present invention.

The method of production of the platable layer-use resin composition used in the present invention is not particularly limited. The above ingredients can be mixed as they are or may be mixed in the state dissolved or dispersed in an organic solvent. Part of the above ingredients may be dissolved or dispersed in an organic solvent to prepare a composition and the remaining ingredients mixed with that composition.

The laminated film of the present invention is produced using such a platable layer-use resin composition and the above-mentioned curable epoxy composition of the present invention. Specifically, the laminated film of the present invention can for example be produced by the following two methods: (1) the method of production by coating, spraying, or casting the above-mentioned platable layer-use resin composition on a support, drying it as desired, then further coating or casting the above-mentioned curable epoxy composition on that and drying it if necessary and (2) the method of production by laminating a platable layer-use shaped article which is obtained by coating, spraying, or casting the above-mentioned platable layer-use resin composition on a support, drying it as desired, and forming this to a sheet shape or film shape and an adhesive layer-use shaped article which is obtained by coating, spraying, or casting the above-mentioned curable epoxy composition on a support, drying it if necessary, and forming this to a sheet shape or film shape and joining these shaped articles. Among these methods of production, since the process is simpler and the productivity is better, the method of production of the above (1) is preferable.

In the method of production of the above-mentioned (1), when coating, spraying, or casting the platable layer-use resin composition on the support and when coating, spraying, or casting the curable epoxy composition on the coated, sprayed, or cast platable layer-use resin composition or, in the method of production of the above-mentioned (2), when shaping the platable layer-use resin composition and the curable epoxy composition into sheet shapes or film shapes to obtain the platable layer-use shaped article and adhesive layer-use shaped article, it is preferable to coat, spray, or cast the platable layer-use resin composition or the curable epoxy composition on the support while adding an organic solvent as desired.

As the support which is used at this time, a resin film or metal foil etc. may be mentioned. As the resin film, a polyethylene terephthalate film, polypropylene film, polyethylene film, polycarbonate film, polyethylene naphthalate film, polyarylate film, nylon film, etc. may be mentioned. Among these films, from the viewpoint of the heat resistance, chemical resistance, peel property, etc., a polyethylene terephthalate film or polyethylene naphthalate film is preferable. As the metal foil, copper foil, aluminum foil, nickel foil, chrome foil, gold foil, silver foil, etc. may be mentioned. Note that, the surface roughness Ra of the support is usually 300 nm or less, preferably 150 nm or less, more preferably 100 nm or less.

The thicknesses of the platable layer-use resin composition and the curable epoxy composition in the method of production of the above-mentioned (1) and the thicknesses of the platable layer-use shaped article and adhesive layer-use shaped article in the method of production of the above-mentioned (2) are not particularly limited, but the thickness of the platable layer when made into a laminated film is preferably 1 to 10 µm, more preferably 1 to 8 µm, furthermore preferably 2 to 5 µm, while the thickness of the adhesive layer is preferably 10 to 100 µm, more preferably 10 to 80 µm, furthermore preferably 15 to 60 µm. If the thickness of the platable layer is too thin, when forming a conductor layer by electroless plating on a cured article which is obtained by curing the laminated film, the formability of the conductor layer is liable to end up falling, while if the thickness of the platable layer is too thick, the cured article which is obtained by curing the laminated film is liable to become larger in linear expansion. Further, if the thickness of the adhesive layer is too small, the wire embedding ability of the laminated film is liable to end up falling.

As the method of coating the platable layer-use resin composition and curable epoxy composition, dip coating, roll coating, curtain coating, die coating, slit coating, gravure coating, etc. may be mentioned.

Further, in the method of production of the above-mentioned (1), after the platable layer-use resin composition is coated, sprayed, or cast on the support or after the curable epoxy composition is coated, sprayed, or cast on the platable layer-use resin composition or, in the method of production of the above-mentioned (2), after the platable layer-use resin composition and the curable epoxy composition are coated on the supports, the compositions may be dried as needed. The drying temperature is preferably made a temperature of an extent where the platable layer-use resin composition and the curable epoxy composition will not cure and is normally 20 to 300° C., preferably 30 to 200° C. Further, the drying time is normally 30 seconds to 1 hour, preferably 1 minute to 30 minutes.

In the laminated film of the present invention, the platable layer and adhesive layer which form the laminated film are preferably in the uncured or semicured state. By making these the uncured or semicured state, it is possible to make the adhesive layer which forms the laminated film of the present invention high in adhesion. Further, the laminated film of the present invention can exhibit the peel strength of the plating by the plateable layer.

(Prepreg)

The prepreg of the present invention is comprised of the above-mentioned film of the present invention or laminated film of the present invention in which a fiber base material is included.

As the fiber base material, a polyimide fiber, polyaramide fiber, polyester fiber, or other organic fiber or glass fiber, carbon fiber, or other inorganic fiber may be mentioned. Further, as the form of the fiber base material, a flat weave or twill weave or other woven fabric or nonwoven fabric etc. may be mentioned. The fiber base material has a thickness of preferably 5 to 100 µm, more preferably 10 to 50 µm. If too thin, the handling becomes difficult, while if too thick, the resin layer becomes relatively thin and its wire embedding ability sometimes becomes insufficient.

When the prepreg of the present invention is comprised of the above-mentioned film of the present invention in which a fiber base material is included, the prepreg of the present invention can be produced by impregnating the curable epoxy composition of the present invention in a fiber base material. In this case, the method of impregnating the curable epoxy composition of the present invention in a fiber base material is not particularly limited, but to add an organic solvent to the curable epoxy composition of the present invention for adjusting the viscosity etc., the method of dipping the fiber base material in the curable epoxy composition to which the organic solvent is added, the method of coating or spraying the curable epoxy composition to which an organic solvent is added on a fiber base material, etc. may be mentioned. In the method of coating or spraying, it is possible to place the fiber base material on a support and coat or spray the curable epoxy composition to which the organic solvent is added on this. Note that, in the present invention, the sheet shape or film shape composite shaped article, in the same way as the above-mentioned sheet shape or film shape article, preferably contains the curable epoxy composition of the present invention in the uncured or semicured state.

Further, after impregnating the curable epoxy composition of the present invention in the fiber base material, it may be dried as desired. The drying temperature is preferably made a temperature of an extent where the curable epoxy composition of the present invention does not cure and is usually 20 to 300° C., preferably 30 to 200° C. If the drying temperature is too high, the curing reaction proceeds too much and the obtained composite shaped article is liable not to become uncured or semicured in state. Further, the drying time is usually 30 seconds to 1 hour, preferably 1 minute to 30 minutes.

Alternatively, when the prepreg of the present invention is comprised of the above-mentioned laminated film of the present invention in which a fiber base material is included, the prepreg of the present invention preferably has an adhesive layer at one surface, a platable layer at the other surface, and a fiber base material at the inside. The method of production is not limited, but for example this can be produced by the following methods: (1) the method of stacking a curable epoxy composition film with support and a platable layer-use resin composition film with a support to sandwich a fiber base material between them with the resin layer sides of the films facing each other and laminating them as desired under pressure, vacuum, heating, or other conditions; (2) the method of impregnating either the curable epoxy composition or platable layer-use resin composition in a fiber base material and drying it as required so as to prepare a prepreg and coating, spraying, or casting the other resin composition on this prepreg or stacking the other resin composition film with a support; or (3) the method of coating, spraying, or casting, either the curable epoxy composition or platable layer-use resin composition to a support to form a layer, placing a fiber base material over it, and further coating, spray, or casting the other resin composition over that to form a layer and drying as desired. Note that, in each method, it is preferable to add an organic solvent to each composition as required to adjust the viscosities of the compositions and thereby control the workability when impregnating them in the fiber base material or coating, spraying, or casting them on the support.

As the support which is used at this time, a polyethylene terephthalate film, polypropylene film, polyethylene film, polycarbonate film, polyethylene naphthalate film, polyarylate film, nylon film, or other resin film or copper foil, aluminum foil, nickel foil, chrome foil, gold foil, silver foil, or other metal foil may be mentioned. These may be applied to either just one surface of the prepreg or to both surfaces.

The thickness of the prepreg of the present invention is not particularly limited, but is preferably made a thickness such that the thickness of the platable layer becomes preferably 1 to 10 µm, more preferably 1.5 to 8 µm, furthermore preferably 2 to 5 µm and, further, the thickness of the adhesive layer becomes preferably 10 to 100 µm, more preferably 10 to 80 µm, furthermore preferably 15 to 60 µm.

When producing the prepreg of the present invention, as the method of coating the platable layer-use resin composition and the curable epoxy composition, dip coating, roll coating, curtain coating, die coating, slit coating, gravure coating, etc. may be mentioned.

Further, in the prepreg of the present invention, in the same way as the above-mentioned film and laminated film of the present invention, the resin composition which forms the prepreg is preferably in an uncured or a semicured state.

Then, the prepreg of the present invention which is obtained in the above way may be made into a cured article by heating and curing it.

The curing temperature is usually 30 to 400° C., preferably 70 to 300° C., more preferably 100 to 200° C. Further, the curing time is 0.1 to 5 hours, preferably 0.5 to 3 hours. The method of heating is not particularly limited. For example, an electric oven etc. may be used for this.

(Laminate)

The laminate of the present invention is one obtained by laminating the above-mentioned film, laminated film, or prepreg of the present invention on a base material. The laminate of the present invention may be one obtained by laminating at least the above-mentioned film, laminated film, or prepreg of the present invention, but is preferably one obtained by laminating a substrate which has a conductor layer on its surface and an electrical insulating layer which is comprised of the film, laminated film, or prepreg of the present invention.

The substrate which has a conductor layer on its surface is one which has a conductor layer on the surface of an electrical insulating substrate. The electrical insulating substrate is formed by curing a resin composition which contains a known electrical insulating material (for example, alicyclic olefin polymer, epoxy resin, maleimide resin, (meth)acrylic resin, diallyl phthalate resin, triazine resin, polyphenylene ether, glass, etc.). The conductor layer is not particularly limited, but is usually a layer which includes wiring which are formed by a conductive metal or other conductor and may further include various circuits as well. The configurations, thicknesses, etc. of the wiring and circuits are not particularly limited. As specific examples of a substrate which has a conductor layer on its surface, a printed circuit board, silicon wafer board, etc. may be mentioned. The substrate which has a conductor layer on its surface has a thickness of usually 10 μm to 10 mm, preferably 20 μm to 5 mm, more preferably 30 μm to 2 mm.

The substrate which has a conductor layer on its surface used in the present invention is preferably pretreated on the surface of the conductor layer so as to improve the adhesion with the electrical insulating layer. As the method of pretreatment, known art can be used without particular limitation. For example, if the conductor layer is comprised of copper, the oxidizing method of bringing a strong alkaline oxidizing solution into contact with the conductor layer surface to form a layer of copper oxide on the conductor surface and roughen it, the method of oxidizing the conductor layer surface by the previous method, then reducing it by sodium borohydride, formalin, etc., the method of depositing plating on the conductor layer to roughen it, the method of bringing an organic acid into contact with the conductor layer to dissolve the grain boundaries of the copper and roughen the layer, the method of forming a primer layer on the conductor layer by a thiol compound, silane compound, etc. and the like may be mentioned. Among these, from the viewpoint of the ease of maintaining the shapes of fine wiring patterns, the method of bringing an organic acid into contact with the conductor layer to dissolve the grain boundaries of the copper and roughen the layer and the method of using thiol compounds or silane compounds etc. to form a primer layer are preferable.

The laminate of the present invention may be produced by hot press bonding, on a substrate which has a conductor layer on its surface, the above-mentioned film of the present invention (that is, the shaped article which is obtained by forming the curable epoxy composition of the present invention into a sheet shape or film shape), laminated film of the present invention (that is, the shaped article of the sheet shape or film shape which is comprised of an adhesive layer of the curable epoxy composition of the present invention and a platable layer), or prepreg of the present invention (the composite shaped article which is comprised of the film of the present invention and a fiber base material or composite shaped article which is comprised of the laminated film of the present invention and the fiber base material) of the present invention.

As the method of hot pressing, the method of superposing the shaped article with a support or composite shaped article on a substrate to contact the conductor layer and using a press laminator, press machine, vacuum laminator, vacuum press, roll laminator, or other pressure device for hot pressing (lamination) may be mentioned. By hot pressing, it is possible to join the conductor layer on the substrate surface and the shaped article or composite shaped article with substantially no clearance at their interface. The shaped article or composite shaped article is usually laminated on the conductor layer of the substrate in the uncured or semicured state.

The temperature of the hot bonding operation is usually 30 to 250° C., preferably 70 to 200° C., the pressure which is applied is usually 10 kPa to 20 MPa, preferably 100 kPa to 10 MPa, and the pressing time is usually 30 seconds to 5 hours, preferably 1 minute to 3 hours. Further, the hot bonding is preferably performed under reduced pressure to improve burying the wiring patterns into the insulating adhesive film or prepreg or to prevent the formation of bubbles. The pressure of the reduced pressure for performing the hot bonding is usually 100 kPa to 1 Pa, preferably 40 kPa to 10 Pa.

(Cured Article)

The cured article of the present invention is one obtained by curing the curable epoxy composition of the present invention and includes any of the film, laminated film, prepreg, and laminate of the present invention which is comprised of the above composition and has been cured. The curing can be performed by suitably heating the curable epoxy composition or film etc. of the present invention under the later explained curing conditions.

For example, the laminate of the present invention can be made a cured article by treatment to cure the film, laminated film, or prepreg of the present invention forming the same. The curing is usually performed by heating the substrate as a whole on which the film, laminated film, or prepreg of the present invention is formed on the conductor layer. The curing can be performed simultaneously with the above-mentioned hot press bonding operation. Further, the hot press bonding operation may be performed under conditions where curing does not occur, that is, at a relatively low temperature and short time, and then curing performed. The film etc. of the present invention are obtained using the curable epoxy composition of the present invention, but when making the polyvalent epoxy compound (A-1) cure by an active ester compound (B) which acts as a curing agent, the melt viscosity at the time of heating is low and excellent resin fluidity is exhibited, so an electrical insulating layer which is comprised of the obtained cured resin exhibits an excellent wire embedding ability.

Further, for the purpose of improving the flatness of the electrical insulating layer or the purpose of increasing the thickness of the electrical insulating layer, it is also possible to bond two or more films, laminated films, or prepregs of the present invention on a conductor layer of a substrate for lamination.

The curing temperature is usually 30 to 400° C., preferably 70 to 300° C., more preferably 100 to 200° C. Further, the curing time is usually 0.1 to 5 hours, preferably 0.5 to 3 hours. The method of heating is not particularly limited. For example, an electrical oven etc. may be used for this.

(Composite Article)

The composite article of the present invention is comprised of the cured article of the present invention on the surface of which a conductor layer is formed.

For example, when the laminate of the present invention forms a multilayer board, the composite article of the present invention is comprised of a laminate on the electrical insulating layer of which a still other conductor layer is formed. As this conductor layer, a metal plating or metal foil may be used. As the metal plating material, gold, silver, copper, rhodium, palladium, nickel, tin, etc. may be mentioned. As the metal foil, one which is used as the support of the above-mentioned film, laminated film, or prepreg may be mentioned. Note that, in the present invention, the method of using a metal plating as a conductor layer is preferable from the viewpoint that fine micro wiring can be formed. Below, the method of production of the composite article of the present invention will be explained illustrating a multilayer circuit board which uses a metal plating as a conductor layer as one example of the composite article of the present invention.

First, the laminate is formed with via holes or through holes which pass through the electrical insulating layer. The via holes are formed for connecting the different conductor layers which form a multilayer circuit board when forming a multilayer circuit board. The via holes and through holes can be formed by chemical treatment such as photolithography or by physical treatment such as drilling, laser irradiation, and plasma etching. Among these methods, the method using a laser ($CO_2$ gas laser, excimer laser, UV-YAG laser, etc.) enables fine via holes to be formed without causing a drop in the characteristics of the electrical insulating layer, so this is preferred.

Next, the surface of the electrical insulating layer of the laminate (that is, the cured article of the present invention) is roughened by surface roughening treatment. The surface roughening treatment is performed so as to enhance the adhesion with the conductor layer which is formed on the electrical insulating layer.

The surface average roughness Ra of the electrical insulating layer is preferably 0.05 µm or more and less than 0.5 µm, more preferably 0.06 µm or more and 0.3 µm or less, while the surface 10-point average roughness Rzj is is preferably 0.3 µm or more and less than 5 µm, more preferably 0.5 µm or more and 3 µm or less. Note that, in this Description, Ra is the arithmetic average roughness which is shown in JIS B0601-2001, while the surface 10-point average roughness Rzjis is the 10-point average roughness which is shown in JIS B0601-2001 Annex 1.

The method of surface roughening treatment is not particularly limited, but the method of bringing the surface of the electrical insulating layer into contact with an oxidizing compound etc. may be mentioned. As the oxidizing compound, an inorganic oxidizing compound or organic oxidizing compound or other known compound which has an oxidizing ability may be mentioned. From the ease of control of the surface average roughness of the electrical insulating layer, use of an inorganic oxidizing compound or organic oxidizing compound is particularly preferable. As the inorganic oxidizing compound, a permanganate, chromic acid anhydride, dichromate, chromate, persulfate, active manganese dioxide, osmium tetraoxide, hydrogen peroxide, periodide, etc. may be mentioned. As the organic oxidizing compound, dicumyl peroxide, octanoyl peroxide, m-chloroperbenzoate, peracetate, ozone, etc. may be mentioned.

The method of using an inorganic oxidizing compound or organic oxidizing compound to roughen the surface of the electrical insulating layer is not particularly limited. For example, the method of dissolving the above oxidizing compound in a solvent which can dissolve it so as to prepare an oxidizing compound solution and bringing this into contact with the surface of the electrical insulating layer may be mentioned. The method of bringing the oxidizing compound solution into contact with the surface of the electrical insulating layer is not particularly limited, but, for example, the dipping method of dipping the electrical insulating layer in the oxidizing compound solution, the buildup method of utilizing the surface tension of the oxidizing compound solution to place the oxidizing compound solution on the electrical insulating layer, the spraying method of spraying the oxidizing compound solution on the electrical insulating layer, or any other method may also be used. By performing the surface roughening treatment, it is possible to improve the adhesion of the electrical insulating layer with the conductor layer and other layers.

The temperature and the time by which these oxidizing compound solutions are brought into contact with the surface of the electrical insulating layer may be freely set by considering the concentration and type of the oxidizing compound, method of contact, etc., but the temperature is usually 20 to 100° C., preferably 30 to 90° C., while the time is usually 0.5 to 60 minutes, preferably 1 to 40 minutes.

Note that, to remove the oxidizing compound after the surface roughening treatment, the surface of the electrical insulating layer after the surface roughening treatment is washed with water. Further, when a substance which cannot be washed off by just water is deposited on the surface, the surface is further washed by a washing solution which can dissolve that substance or another compound is brought into contact with the surface to convert the substance into one which can be dissolved in water and then the surface is washed by water. For example, when bringing an aqueous solution of potassium permanganate or an aqueous solution of sodium permanganate or other alkali aqueous solution into contact with the electrical insulating layer, to remove the film of manganese dioxide which is formed, it is possible to using a mixed solution of hydroxylamine sulfate and sulfuric acid or other acidic aqueous solution to neutralize/reduce the surface, then wash it by water.

Next, after the electrical insulating layer of the laminate is treated to roughen its surface, a conductor layer is formed on the surface of the electrical insulating layer and the inside wall surfaces of the via holes or through holes.

The method of formation of the conductor layer is performed, from the viewpoint of enabling formation of a conductor layer which is excellent in adhesion, using the electroless plating method.

For example, when using electroless plating to form a conductor layer, first, before forming a metal thin layer on the surface of the electrical insulating layer, the general practice has been to deposit silver, palladium, zinc, cobalt, or another catalyst nuclei on the electrical insulating layer. The method of depositing catalyst nuclei on the electrical insulating layer is not particularly limited, but, for example, the method of dipping the article in a solution obtained by dissolving silver, palladium, zinc, cobalt, or other metal compounds or their salts or complexes in water, alcohol, chloroform or another organic solvent in 0.001 to 10 wt % in concentration (as desired, also possibly including an acid, alkali, complexing agent, reducing agent, etc.), then reducing the metal etc. may be mentioned.

As the electroless plating solution which is used in the electroless plating, a known self-catalyst type electroless plating solution may be used. It is not particularly limited in the type of metal, the type of reducing agent, the type of complexing agent, the concentration of hydrogen ions, the concentration of dissolved oxygen, etc. which are contained in the plating solution. For example, an electroless copper plating solution which contains ammonium hypophosphite, hypophosphoric acid, ammonium borohydride, hydrazine, formalin, etc. as a reducing agent; an electroless nickel-phosphorus plating solution which contains sodium hypophosphite as a reducing agent; an electroless nickel-boron plating solution which contains dimethylamineborane as a reducing agent; an electroless palladium plating solution; an electroless palladium-phosphorus plating solution which contains sodium hypophosphite as a reducing agent; an electroless gold plating solution; an electroless silver plating solution; an electroless nickel-cobalt-phosphorus plating solution which contains sodium hypophosphite as a reducing agent, or other electroless plating solution can be used.

After forming the metal thin layer, the substrate surface may be brought into contact with a rustproofing agent to make it rustproof. Further, after forming the metal thin layer, the metal thin layer may be heated to raise the adhesiveness. The heating temperature is usually 50 to 350° C., preferably 80 to 250° C. Note that, at this time, the heating may be performed under pressed conditions. As the pressing method at this time, for example, the method of using a hot press, a pressurizing and heating roll, and other physical pressing means may be mentioned. The pressure which is applied is usually 0.1 to 20 MPa, preferably 0.5 to 10 MPa. If this range, high adhesion can be secured between the metal thin layer and the electrical insulating layer.

The thus formed metal thin layer is formed with a plating-use resist pattern and the plating is further grown over it by electroplating or other wet plating (thickening plating). Next, the resist is removed and the surface is further etched to etch the metal thin layer into the pattern shapes and form the conductor layer. Therefore, the conductor layer which is formed by this method is usually comprised of the patterned metal thin layer and the plating which is grown over that.

Alternatively, when using metal foil instead of metal plating as the conductor layer which forms the multi layer circuit board, the following method can be used for production.

That is, first, the same procedure is followed as above to prepare a laminate which is comprised of an electrical insulating layer comprised of a film or prepreg and a conductor layer comprised of a metal foil. As such a laminate, when laminating and forming, it is preferable to make the curable epoxy composition a hardness enabling the required properties to be held and, due to this, it is preferable to prevent problems when subsequently working it or when forming a multilayer circuit board. In particular, it is preferable to form the laminate under a vacuum. Note that, a laminate which is comprised of such an electrical insulating layer comprised of a film or prepreg and a conductor layer comprised of a metal foil can, for example, be used for a printed circuit board by a known subtractive method.

Further, the prepared laminate is formed with, in the same way as above, via holes or through holes which pass through the electrical insulating layer, then the resin residue in the formed via holes is removed by desmearing the laminate which forms the through holes. The method of desmearing is not particularly limited, but for example the method of causing contact with a solution of permanganate or another oxidizing compound (desmearing solution) may be mentioned. Specifically, the laminate which is formed with the via holes can be dipped in a 60 to 80° C. aqueous solution which is adjusted to a concentration of sodium permanganate of 70 g/liter and a concentration of sodium hydroxide of 40 g/liters for 1 to 50 minutes with shaking so as to desmear it.

Next, after the laminate is desmeared, a conductor layer is formed at the inside wall surfaces of the via holes. The method of forming the conductor layer is not particularly limited, but it is possible to use either the electroless plating method or electroplating method. From the viewpoint of being able to form a conductor layer with a good adhesion, it is possible to use the electroless plating method in the same way as the method of forming a metal plating as the conductor layer.

Next, the inside wall surfaces of the via holes are formed with a conductor layer, then the metal foil is formed with a resist pattern for plating use and further electroplating or other wet plating is used to grow a plating (thick plating), then the resist is removed and the metal foil is further etched to pattern it by etching and form a conductor layer. Therefore, the conductor layer which is formed by this method is comprised of a patterned metal foil and plating which is grown on this.

By using the above obtained multilayer circuit board as the substrate for producing the above-mentioned laminate, hot pressing the above-mentioned shaped article or composite shaped article, and curing the same to form the electrical insulating layer and further forming a conductor layer on this in accordance with the above method, then repeating these steps, it is possible to form a further multilayer structure and thereby possible to obtain the desired multilayer circuit board.

The thus obtained composite article of the present invention (and the multilayer circuit board of one example of the composite article of the present invention) has an electrical insulating layer which is comprised of the curable epoxy composition of the present invention (the cured article of the present invention). The electrical insulating layer is excellent in electrical characteristics, heat resistance, wire embedding flatness, and flexibility, so the composite article of the present invention (and the multilayer circuit board of one example of the composite article of the present invention) can be suitably used for various applications.

(Substrate for Electronic Material Use)

The substrate for electronic material use of the present invention is comprised of the cured article or composite article of the present invention explained above. The substrate for electronic material use of the present invention which is comprised of the cured article or composite article of the present invention can be suitably used for a mobile phone, PHS, laptop PCs, PDAs (personal digital assistants), mobile TV phones, PCs, super computers, servers, routers, liquid crystal projectors, engineering work stations (EWS), pagers, word processors, televisions, viewfinder type or monitor direct viewing type video tape recorders, electronic handheld devices, electronic desktop computers, car navigation systems, POS terminals, devices provided with touch panels, and other various electronic equipment.

EXAMPLES

B Below, examples and comparative examples will be given to more specifically explain the present invention. Note that, in the examples, the "parts" and "%", unless particularly indicated otherwise, are based on weight. The various types of properties were evaluated by the following methods.

(1) Number Average Molecular Weight (Mn) and Weight Average Molecular Weight (Mw) of Alicyclic Olefin Polymer These were measured using tetrahydrofuran as a developing solvent and using gel permeation chromatography (GPC) and were found as values converted for polystyrene.

(2) Hydrogenation Ratio of Alicyclic Olefin Polymer

The ratio of the number of moles of the unsaturated bonds which were hydrogenated with respect to the number of moles of the unsaturated bonds in the polymer before the hydrogenation was found by measurement of the 400 MHz $^1$H-NMR spectrum. This was used as the hydrogenation ratio.

(3) Glass Transition Temperature

From the film-shaped cured article, a small piece of a width 6 mm, length 15.4 mm, and thickness 40 µm was cut. Under conditions of a distance between support points of 10 mm and a temperature elevation rate of 10° C./min, a thermomechanical analyzer (TMA/SDrA840: made by Metler Toledo) was used for measurement to obtain a stress-temperature curve. A tangent was drawn to the inflection point. From the intersecting point of this tangent, the glass transition temperature (Tg) of the film-shaped cured article was found. The following evaluation criteria were used for evaluation. The higher the glass transition temperature, the better the heat resistance.

(Evaluation Criteria)

A: glass transition temperature of 150° C. or more

B: glass transition temperature of less than 150° C.

(4) Dielectric Tangent

A width 2.6 mm, length 80 mm, thickness 40 μm piece was cut out from a film shaped cured article, measured for dielectric tangent (tan δ) at 10 GHz using a resonant cavity perturbation method permittivity measurement apparatus. The following evaluation criteria were used for evaluation.
(Evaluation Criteria)
  A: dielectric tangent of less than 0.007
  B: dielectric tangent of 0.007 to less than 0.011
(5) Desmearing Ability A varnish which contains a glass filler and halogen-free epoxy compound was impregnated in glass fiber to obtain a core material. On the surfaces of the obtained core material, sheets of thickness 18 μm copper were bonded to prepare a thickness 0.8 mm, vertical 150 mm×horizontal 150 mm double-sided copper-clad board. The copper surfaces of this board were etched by an etchant (product name "CZ-8100", made by MEC Co., Ltd.) by about 2 μm. Next, on the two surfaces of this, film shaped articles with supports were laminated, then just the supports were peeled off. The result was heated in an air atmosphere at 180° C. for 30 minutes to cure the film shaped articles and form resin layers comprised of film-shaped cured articles. The obtained laminate cured article was processed using a $CO_2$ laser apparatus (LC-2G212/2C, made by Hitachi Ltd.) under conditions of an output of 0.65 W, three shots, a processing diameter (top surface) of 55 μm, and a processing diameter (bottom surface) of 50 μm to form holes for via hole use running through the resin layer to the copper surfaces so as to prepare a substrate for evaluation of the desmearing ability. This substrate was dipped in a 60° C. aqueous solution prepared to contain a swelling solution ("Swelling Dip Securiganth P", made by Atotech, "Securiganth" is a registered trademark) 500 ml/liter and sodium hydroxide 3 g/liter for 15 minutes while shaking, then was rinsed. Next, this was dipped in an 80° C. aqueous solution prepared to contain an aqueous solution of permanganate ("Concentrate Compound CP", made by Atotech) 640 ml/liter and sodium hydroxide concentration 40 g/liter for 20 minutes while shaking, then was rinsed. Next, the laminate cured article was dipped for 5 minutes in a 40° C. aqueous solution prepared to contain a hydroxylamine sulfate aqueous solution ("Reduction Securiganth P 500", made by Atotech, "Securiganth" is a registered trademark) 100 ml/liter and sulfuric acid 35 ml/liter to neutralize and reduce it, then was rinsed. Next, the substrate was dipped for 5 minutes in a 40° C. aqueous solution prepared to contain a hydroxylamine sulfate 18 g/liter and sulfuric acid 65 g/liter to neutralize and reduce it, then was rinsed. The bottom surfaces and cross-sections of the hole parts for via hole use in the thus obtained substrate were observed by an electron microscope (magnification: 5000×) and the desmearing ability was evaluated by the following evaluation criteria.
(Evaluation Criteria)
  A: no resin residue
  B: resin residue
(6) Adhesion A thickness 35 μm electrolytic copper foil was etched on its surface by an etchant (product name "CZ-8100", made by MEC Co., Ltd.) by about 2 μm. On the etched surface of the electrolytic copper foil, the film-shaped article was superposed so that its resin layer side contacted it, then a vacuum laminator was used to hot press-bond them under the conditions of a vacuum degree of 1 kPa or less, 90° C., 30 seconds, and pressure 0.7 MPa. Next, the support was peeled off from the surface of the film-shaped article at the opposite side to the resin layer, a glass epoxy copper-clad board (FR-4) which was etched by the etchant by about 2 μm was laid over the surface of the exposed resin layer, then a vacuum laminator was used to hot press-bond them under the same conditions as above. The thus obtained composite shaped article was heated in an oven at 180° C. for 90 minutes to obtain a laminate cured article. The peel strength of the copper foil from the obtained laminate cured article was measured in accordance with JIS C6481 and the following evaluation criteria were used for evaluation.
(Evaluation Criteria)
  A: peel strength of 5N/cm or more
  B: peel strength of less than 5N/cm
(7) Solder Heat Resistance From a multilayer printed circuit board, vertical 50 mm×horizontal 50 mm small pieces were cut out and used as test pieces. The test pieces were floated for 10 seconds in a solder temperature 260° C. solder bath, allowed to stand at room temperature for 30 seconds, and checked for presence of blistering of the conductor layer. This test was repeated until blisters were confirmed, then the following evaluation criteria were used to evaluate the heat resistance of the film-shaped cured article with respect to solder. The greater the number of times of repetition of the test, the better the solder heat resistance. Note that, the evaluations were conducted repeatedly five times using five similar test pieces.
(Evaluation Criteria)
  A: Number of times of repetition of test is 10 times or more for all five test pieces.
  B: Number of times of repetition of test is 10 times or more for one to four of the five pieces.
  C: Number of times of repetition of test is less than 10 times for all five pieces.

Synthesis Example 1

Tetracyclo[$6.5.0.1^{2,5}.0^{8,13}$]trideca-3,8,10,12-tetraene (MTF) 80 molar parts, N-(4-phenyl)-(5-norbornene-2,3-dicarboxyimide) (NBPI) 20 molar parts, 1-hexene 6 molar part, anisole 590 molar parts, and a ruthenium-based polymerization catalyst constituted by 4-acetoxybenzylidene (dichloro) (4,5-dibromo-1,3-dimesityl-4-imidazolin-2-ylidene) (tricyclohexylphosphine) ruthenium (C1063, made by Wako Pure Chemical Industries) 0.015 molar part were charged into a nitrogen-substituted pressure-resistant glass reactor. While stirring, the mixture was subjected to a polymerization reaction at 80° C. for 1 hour to obtain a solution of a ring-opened polymer. This solution was measured by gas chromatography, whereupon it was confirmed substantially no monomers remained. The polymerization conversion rate was 99% or more.

Next, the solution of the obtained ring-opened polymer was charged into a nitrogen-substituted autoclave equipped with a stirrer, then the mixture was stirred at 150° C. under a hydrogen pressure of 7 MPa for 5 hours to cause a hydrogenation reaction. The obtained hydrogenated reaction solution was concentrated to obtain a solution of alicyclic olefin polymer (1) (solid content concentration 55.50). The obtained alicyclic olefin polymer (1) had a weight average molecular weight of 50,000, number average molecular weight of 20,000, and hydrogenation rate of 97%.

Example 1

(Preparation of Curable Epoxy Composition)

100 parts of a phenol novolac type epoxy compound which has a dicyclopentadiene structure (product name "Epiclon HP-7200HH", made by DIC, epoxy equivalent:

280) as a polyvalent epoxy compound (A-1), 118.5 parts of an active ester compound (product name "Epiclon HPC-8000-65T", nonvolatile content 65% toluene solution, made by DIC, active ester group equivalent: 223) (converted to active ester compound, 77 parts) as an active ester compound (B), 15.4 parts of a triazine structure-containing cresol novolac resin (product name "Phenolite LA-3018-50P", nonvolatile content 50% propyleneglycol monomethyl ether solution, made by DIC, active hydroxyl group equivalent: 154) (converted to triazine structure-containing cresol novolac resin, 7.7 parts) as a triazine structure-containing phenol resin (C), 9 parts of a solution of alicyclic olefin polymer (1) obtained in Synthesis Example 1 (converted to alicyclic olefin polymer (1), 5 parts), 355 parts of silica (product name "SC2500-SXJ", made by Admatechs) as a filler, 0.4 part of a hindered phenol-based antioxidant (product name "Irganox (registered trademark) 3114", made by BASF) as an antiaging agent, and 110 parts of anisole were mixed and stirred by a planetary mixer for 3 minutes. Furthermore, to this, 3.3 parts of a solution of 30% 1-benzyl-2-phenylimidazole dissolved in anisole (converted to curing accelerator, 1 part) as a curing accelerator was mixed and stirred by a planetary mixer for 5 minutes to obtain a varnish of a curable epoxy composition. Note that, in the varnish, the content of the filler was 65% converted to solid content.

(Preparation of Film Shaped Article)

Next, the above obtained varnish of the curable epoxy composition was applied by a die coater on a vertical 300 mm×horizontal 300 mm size, thickness 38 μm, surface average roughness Ra 0.08 μm polyethylene terephthalate film (support: Lumirror (registered trademark) T60, made by Toray Industries Inc.), then dried in a nitrogen atmosphere at 80° C. for 10 minutes to obtain a film shaped article of thickness 43 μm resin composition on a support. The obtained film-shaped article was used in accordance with the above method to evaluate the desmearing ability and adhesion. The results are shown in Table 1.

(Preparation of Film Shaped Cured Article)

Next, a piece which was cut out from the thus obtained film shaped article of the curable epoxy composition was placed on a thickness 10 μm copper foil. This was set, in the state with the support attached, so that the curable epoxy composition became the inside. A vacuum laminator which was provided with heat resistant rubber press plates at the top and bottom was used to reduce the pressure to 200 Pa and hot press bond the laminate at a temperature of 110° C. and a pressure of 0.1 MPa for 60 seconds, the support was peeled off, then the laminate was heated and cured at 180° C. for 120 minutes in the air. After curing, the copper foil is cut from cured resin with the copper foil, then the cut copper foil was dissolved in a 1 mol/liter ammonium persulfate aqueous solution to obtain a film shaped cured article. The obtained film shaped cured article was used in accordance with the above methods to measure the glass transition temperature and dielectric tangent. The results are shown in Table 1.

Examples 2 to 6 and Comparative Examples 1 to 2

Except for changing the types and amounts of the epoxy compound (A), the amount of the active ester compound (B), and the amount of the triazine structure-containing phenol resin (C) in accordance with the compositions of the curable epoxy compositions in Examples 2 to 6 and Comparative Examples 1 to 2 of Table 1, the same procedures were followed as in Example 1 to obtain varnishes of curable epoxy compositions, film-shaped articles, and film-shaped cured articles and the same procedures were followed to measure and evaluate them. Note that, in the varnish, the content of the filler was 65% converted to solid content. The results are shown in Table 1.

In Table 1, the alicyclic epoxy compound (A-2) is product name "Epolead GT401" (made by Daicel Chemical, epoxy equivalent: 220), the epoxy-modified rubber is product name "Epolead PB3600" (made by Daicel Chemical, epoxy equivalent: 200), and the bisphenol A type epoxy compound is product name "jER828EL" (made by Mitsubishi Chemical Corporation, epoxy equivalent: 189).

TABLE 1

| | | Example | | | | | | Comp. Ex. | |
|---|---|---|---|---|---|---|---|---|---|
| | | 1 | 2 | 3 | 4 | 5 | 6 | 1 | 2 |
| Composition of curable epoxy composition (parts) | | | | | | | | | |
| Epoxy compound (A) | Polyvalent epoxy compound (A-1): phenol novolac type epoxy compound having dicyclopentadiene structure | 100 | 80 | 90 | 50 | 100 | 100 | 0 | 100 |
| | Alicyclic epoxy compound (A-2) | 0 | 20 | 0 | 0 | 0 | 0 | 0 | 0 |
| | Epoxy-modified rubber: epoxylated polybutadiene | 0 | 0 | 10 | 0 | 0 | 0 | 0 | 0 |
| | Bisphenol A type epoxy compound | 0 | 0 | 0 | 50 | 0 | 0 | 100 | 0 |
| | Active ester compound (B) | 77 | 81.3 | 80.2 | 95.7 | 88.3 | 46.3 | 93.5 | 88.5 |
| | Triazine structure-containing phenol resin (C) | 7.7 | 8.1 | 8 | 9.6 | 13.7 | 4.6 | 9.3 | 0 |
| | Alicyclic olefin polymer | 5 | 5 | 5 | 5 | 5 | 5 | 5 | 5 |
| | Weight ratio of triazine structure-containing phenol resin (C)/ active ester compound (B) | 0.1 | 0.1 | 0.1 | 0.1 | 0.2 | 0.1 | 0.1 | 0 |
| | Equivalent ratio of epoxy compound/ [active ester compound(B) + triazine structure-containing phenol resin (C)] | 0.9 | 0.9 | 0.9 | 0.9 | 0.9 | 1.5 | 1.1 | 0.9 |
| Results of evaluation | | | | | | | | | |
| | Glass transition temperature (Tg) | A | A | A | A | A | A | B | A |
| | Dielectric tangent (Tan δ) | A | A | A | A | B | B | A | A |
| | Desmearing ability | B | A | A | B | B | B | B | B |
| | Adhesion | A | A | A | A | A | A | A | B |

As shown in Table 1, according to the curable epoxy composition of the present invention, a film-shaped cured article which is excellent in heat resistance, electrical characteristics, and desmearing ability is obtained. Therefore, according to the above composition, it will be understood that an electrical insulating layer which has such excellent characteristics can be formed.

Synthesis Example 2

As a first polymerization stage, 35 molar parts of 5-ethylidene-bicyclo[2.2.1]hept-2-ene (EdNB), 0.9 molar part of 1-hexene, 340 molar parts of anisole, and 0.005 molar part of 4-acetoxybenzylidene(dichloro) (4,5-dibromo-1,3-dimesityl-4-imidazolin-2-ylidene) (tricyclohexylphosphine) ruthenium (C1063, made by Wako Pure Chemical Industries) as a ruthenium-based polymerization catalyst were charged into a nitrogen-substituted pressure-resistant glass reactor and subjected to a polymerization reaction under stirring at 80° C. for 30 minutes to obtain a solution of a norbornene-based ring-opened polymer.

Next, as a second polymerization stage, to the solution which was obtained at the first polymerization stage, 45 molar parts of tetracyclo[6.5.0.1$^{2,5}$.0$^{8,13}$]trideca-3,8,10,12-tetraene (MTF), 20 molar parts of bicyclo[2.2.1]hept-2-ene-5,6-dicarboxylic acid anhydride, 250 molar parts of anisole, and 0.01 molar part of C1063 were added and subjected to a polymerization reaction under stirring at 80° C. for 1.5 hours to obtain a solution of a norbornene-based ring-opened polymer. This solution was measured by gas chromatography, whereupon it was confirmed that substantially no monomer remained. The polymerization conversion rate was 99% or more.

Next, a nitrogen-substituted autoclave equipped with a stirrer was charged with the solution of the obtained ring-opened polymer, 0.03 molar part of C1063 was added, and the mixture was stirred at 150° C. under a hydrogen pressure of 7 MPa for 5 hours to cause a hydrogenation reaction and obtain a solution of a hydrogenate of the norbornene-based ring-opened polymer constituted by the alicyclic olefin polymer (2). The obtained alicyclic olefin polymer (2) had a weight average molecular weight of 60,000, number average molecular weight of 30,000, and molecular weight distribution of 2. Further, the hydrogenation rate was 95%, while the content of the repeating units which have carboxylic acid anhydride groups was 20 mol %. The solid content concentration of the solution of the alicyclic olefin polymer (2) was 22%.

Example 7

(Platable Layer-Use Resin Composition)

454 parts of the solution of the alicyclic olefin polymer (2) which was obtained in Synthesis Example 2 (converted to alicyclic olefin polymer (2), 100 parts), 36 parts of a phenol novolac type epoxy compound which has a dicyclopentadiene structure ("Epiclon HP7200L", made by DIC, "Epiclon" is a registered trademark) as a curing agent, 24.5 parts of an inorganic filler constituted by silica ("Admafine SO-C1", made by Admatechs, average particle size 0.25 μm, "Admafine" is a registered trademark), 1 part of tris(3,5-di-t-butyl-4-hydroxybenzyl)-isocyanulate ("Irganox (registered trademark) 3114", made by BASF) as an antiaging agent, 0.5 part of 2-[2-hydroxy-3,5-bis(α,α-dimethylbenzyl)phenyl]-2H-benzotriazole as an ultraviolet absorber, and 0.5 part of 1-benzyl-2-phenylimidazole as a curing accelerator were mixed in anisole and mixed to give a concentration of the compounding agents of 16% so as to obtain a varnish of the platable layer-use resin composition.

(Preparation of Laminated Film)

The varnish of the platable layer-use resin composition which was obtained above was applied on a thickness 38 μm polyethylene terephthalate film (support) by using a wire bar, then was dried in a nitrogen atmosphere at 80° C. for 10 minutes to obtain a film with a support on which a thickness 3 μm platable layer comprised of an uncured platable layer-use resin composition was formed.

Next, the surface of the film with the support on which the platable layer comprised of the platable layer-use resin composition was formed was coated with the varnish of the curable epoxy composition which was obtained in Example 1 by using a doctor blade (made by Tester Sangyo Co., Ltd) and an auto film applicator (made by Tester Sangyo Co., Ltd), then was dried in a nitrogen atmosphere at 80° C. for 10 minutes to obtain a laminated film with the support on which a total thickness 43 μm platable layer and adhesive layer were formed. The laminated film with the support was formed by the support, the platable layer comprised of the platable layer-use resin composition, and the adhesive layer comprised of the curable epoxy composition in that order.

(Preparation of Laminate Cured Article)

Next, separate from the above, a varnish which contains glass filler and a halogen-free epoxy resin was impregnated in glass fibers to obtain a core material. On the surfaces of this, thickness 18 μm copper was bonded to obtain a thickness 0.8 mm, 150 mm square (vertical 150 mm and horizontal 150 mm) two-sided copper-clad substrate. On the surfaces of this, conductor layers with interconnect widths and interconnect pitches of 50 μm and thicknesses of 30 μm and with surfaces microetched by an etchant (product name "CZ-8100", made by MEC Co., Ltd.) were formed to obtain an inside layer substrate.

At the two surfaces of the inside layer substrate, the above obtained laminated film with the support cut into 150 mm square pieces were bonded with the surfaces at the curable epoxy composition sides becoming the insides, then the laminate was pressed by primary pressing. The primary pressing was hot press bonding by a vacuum laminator which is provided with press plates made of heat resistant rubber at the top and bottom under a reduced pressure of 200 Pa at a temperature 110° C. with a pressure of 0.1 MPa for 90 seconds. Furthermore, a hydraulic press apparatus which is provided with metal press plates at the top and bottom was used for hot press bonding at a press bonding temperature of 110° C. and 1 MPa for 90 seconds. Next, the supports were peeled off to obtain a laminate of a resin layer which was comprised of the curable epoxy composition and the platable layer-use resin composition and the inside layer substrate. Furthermore, the laminate was allowed to stand in an air atmosphere at 180° C. for 60 minutes to make the resin layer cure and form an electrical insulating layer on the inside layer substrate.

(Swelling Treatment Step)

The obtained laminate cured article was dipped while shaking in a 60° C. aqueous solution which was prepared to contain a swelling solution ("Swelling Dip Securiganth P", made by Atotech, "Securiganth" is a registered trademark) 500 ml/liter and sodium hydroxide 3 g/liter for 15 minutes, then was rinsed.

(Oxidizing Treatment Step)

Next, the laminate cured article was dipped while shaking in an 80° C. aqueous solution which was prepared to contain an aqueous solution of permanganate ("Concentrate Compact CP", made by Atotech) 640 ml/liter and a concentration of sodium hydroxide of 40 g/liter for 20 minutes, then was rinsed.

(Neutralizing/Reduction Treatment Step)

Next, the laminate cured article was dipped in a 40° C. aqueous solution which was prepared to contain an aqueous solution of hydroxylamine sulfate ("Reduction Securiganth P 500", made by Atotech, "Securiganth" is a registered trademark) 100 ml/liter and sulfuric acid 35 ml/liter for 5 minutes to neutralize and reduce it, then was rinsed.

(Cleaner/Conditioner Step)

Next, the laminate cured article was dipped in a 50° C. aqueous solution which was prepared to contain a cleaner/conditioner aqueous solution ("Alcup MCC-6-A", made by Uyemura & Co., Ltd. "Alcup" is a registered trademark) of a concentration of 50 ml/liter for 5 minutes to treat it with the cleaner and conditioner. Next, the laminate was dipped in 40° C. rinsing water for 1 minute, then was rinsed.

(Soft Etching Step)

Next, the laminate cured article was dipped in an aqueous solution which was prepared to contain a sulfuric acid concentration of 100 g/liter and sodium persulfate of 100 g/liter for 2 minutes to be soft etched, then was rinsed.

(Pickling Step)

Next, the laminate cured article was dipped in an aqueous solution which was prepared to contain a sulfuric acid concentration of 100 g/liter for 1 minute to be pickled, then was rinsed.

(Catalyst Imparting Step)

Next, the laminate cured article was dipped in a 60° C. Pd salt-containing plating catalyst aqueous solution which was prepared to contain Alcup Activator MAT-1-A (product name, made by Uyemura & Co., Ltd. "Alcup" is a registered trademark) 200 ml/liter, Alcup Activator MAT-1-B (product name, made by Uyemura & Co., Ltd. "Alcup" is a registered trademark) 30 ml/liter, and sodium hydroxide 0.35 g/liter for 5 minutes, then was rinsed.

(Activation Step)

Next, the laminate cured article was dipped in an aqueous solution which was prepared to contain Alcup Reducer MAB-4-A (product name, made by Uyemura & Co., "Alcup" is a registered trademark) 20 ml/liter and Alcup Reducer MAB-4-B (product name, made by Uyemura & Co., Ltd. "Alcup" is a registered trademark) 200 ml/liter at 35° C. for 3 minutes to reduce the plating catalyst, then was rinsed.

(Accelerator Treatment Step)

Next, the laminate cured article was dipped in an aqueous solution which was prepared to contain Alcup Accelerator MEL-3-A (product name, made by Uyemura & Co., Ltd. "Alcup" is a registered trademark) 50 ml/liter at 25° C. for 1 minute.

(Electroless Plating Step)

The thus obtained laminate cured article was dipped in an electroless copper plating solution which was prepared to contain Thru-Cup PEA-6-A (product name, made by Uyemura & Co., Ltd. "Thru-Cup" is a registered trademark) 100 ml/liter, Thru-Cup PEA-6-B-2X (product name, made by Uyemura & Co. Ltd.) 50 ml/liter, Thru-Cup PEA-6-C (product name, made by Uyemura & Co. Ltd.) 14 ml/liter, Thru-Cup PEA-6-D (product name, made by Uyemura & Co. Ltd.) 15 ml/liter, Thru-Cup PEA-6-E (product name, made by Uyemura & Co. Ltd.) 50 ml/liter, and 37 wt % formalin aqueous solution 5 ml/liter, while blowing in air, at a temperature of 36° C. for 20 minutes for electroless copper plating so as to form an electroless plating film on the laminate cured article surface (surface of platable layer comprised of platable layer-use resin composition).

Next, the laminate cured article which was formed with the electroless plating film was dipped in a corrosion inhibiting solution which was prepared to contain AT-21 (product name, made by Uyemura & Co. Ltd.) in 10 ml/liter at room temperature for 1 minute, then was rinsed. Furthermore, this was dried to prepare a corrosion-resistant treated laminate cured article. This corrosion-resistant treated laminate cured article was annealed in an air atmosphere at 150° C. for 30 minutes.

The annealed laminate cured article was electroplated with copper to form a thickness 18 μm electroplated copper layer. Next, the laminate cured article was heat treated at 180° C. for 60 minutes to thereby obtain a two-sided two-layer multilayer printed circuit board comprised of a laminate cured article on which circuits are formed by conductor layers which are comprised of the metal thin film layers and electroplated copper layers. The obtained multilayer printed circuit board was used in accordance with the above method to evaluate the solder heat resistance. The results are shown in Table 2.

Examples 8 to 12 and Comparative Examples 3 to 4

Except for using a varnish of a curable epoxy composition which is used for forming a binder layer constituted by, instead of the varnish which was obtained in Example 1, the varnishes which were obtained in Examples 2 to 6 and Comparative Examples 1 to 2, the same procedure was followed as in Example 7 to obtain a multilayer printed circuit board and the same procedure was followed to measure and evaluate the solder heat resistance. The results are shown in Table 2.

TABLE 2

| | | Example | | | | | | Comp. Ex. | |
|---|---|---|---|---|---|---|---|---|---|
| | | 7 | 8 | 9 | 10 | 11 | 12 | 3 | 4 |
| Composition of curable epoxy composition (parts) | | | | | | | | | |
| Epoxy compound (A) | Polyvalent epoxy compound (A-1): phenol novolac type epoxy compound having dicyclopentadiene structure | 100 | 80 | 90 | 50 | 100 | 100 | 0 | 100 |
| | Alicyclic epoxy compound (A-2) | 0 | 20 | 0 | 0 | 0 | 0 | 0 | 0 |
| | Epoxy-modified rubber: epoxylated polybutadiene | 0 | 0 | 10 | 0 | 0 | 0 | 0 | 0 |
| | Bisphenol A type epoxy compound | 0 | 0 | 0 | 50 | 0 | 0 | 100 | 0 |
| | Active ester compound (B) | 77 | 81.3 | 80.2 | 95.7 | 88.3 | 46.3 | 93.5 | 88.5 |
| | Triazine structure-containing phenol resin (C) | 7.7 | 8.1 | 8 | 9.6 | 13.7 | 4.6 | 9.3 | 0 |
| | Alicyclic olefin polymer | 5 | 5 | 5 | 5 | 5 | 5 | 5 | 5 |
| | Weight ratio of triazine structure-containing phenol resin (C)/active ester compound (B) | 0.1 | 0.1 | 0.1 | 0.1 | 0.2 | 0.1 | 0.1 | 0 |

TABLE 2-continued

|  | Example | | | | | | Comp. Ex. | |
| --- | --- | --- | --- | --- | --- | --- | --- | --- |
|  | 7 | 8 | 9 | 10 | 11 | 12 | 3 | 4 |
| Equivalent ratio of epoxy compound/ [active ester compound(B) + triazine structure-containing phenol resin (C)] | 0.9 | 0.9 | 0.9 | 0.9 | 0.9 | 1.5 | 1.1 | 0.9 |
| Results of evaluation | | | | | | | | |
| Solder heat resistance | A | A | A | B | A | A | C | B |

As shown in Table 2, according to the curable epoxy composition of the present invention, a film-shaped cured article which is excellent in heat resistance, electrical characteristics, desmearing ability, and adhesion and further is excellent in solder heat resistance can be obtained. Therefore, according to this composition, it will be understood that an electrical insulating layer which has such excellent properties can be formed.

The invention claimed is:

1. A curable epoxy composition comprising an epoxy compound (A), active ester compound (B), and triazine structure-containing phenol resin (C), wherein the epoxy compound (A) includes a polyvalent epoxy compound (A-1) which has an alicyclic condensed polycyclic structure in a ratio of content of 30 wt % or more and wherein a ratio of content of the triazine structure-containing phenol resin (C) with respect to the active ester compound (B) is less than 0.2 as a weight ratio [triazine structure-containing phenol resin (C)/active ester compound (B)].

2. The curable epoxy composition according to claim 1, wherein the epoxy compound (A) further includes an alicyclic epoxy compound (A-2).

3. The curable epoxy composition according to claim 1, wherein the epoxy compound (A) is such that the content ratio of a bisphenol type epoxy compound is less than 30 wt %.

4. The curable epoxy composition according to claim 1, wherein the polyvalent epoxy compound (A-1) which has an alicyclic condensed polycyclic structure is a phenol novolac type epoxy compound which has an alicyclic condensed polycyclic structure.

5. The curable epoxy composition according to claim 1, further comprising an alicyclic olefin polymer which contains an aromatic ring and/or hetero atom and does not have reactivity with an epoxy group.

6. A film comprising the curable epoxy composition according to claim 1.

7. A laminated film having a binder layer which comprises the curable epoxy composition according to claim 1 and a plateable layer which comprises a platable layer-use resin composition.

8. The laminated film according to claim 7, wherein the plateable layer includes an alicyclic olefin polymer in 50 wt % or more.

9. A prepreg comprising the film according to claim 6 and a fiber base material.

10. A laminate obtained by laminating a substrate with the film according to claim 6.

11. A cured article obtained by curing the curable epoxy composition according to claim 1.

12. A cured article obtained by curing the film according to claim 6.

13. A cured article obtained by curing the laminated film according to claim 7.

14. A cured article obtained by curing the prepreg according to claim 9.

15. A cured article obtained by curing the laminate according to claim 10.

16. A composite article obtained by forming a conductor layer on a surface of the cured product according to claim 11.

17. A composite article obtained by forming a conductor layer on a surface of the cured product according to claim 12.

18. A composite article obtained by forming a conductor layer on a surface of the cured product according to claim 13.

19. A composite article obtained by forming a conductor layer on a surface of the cured product according to claim 14.

20. A composite article obtained by forming a conductor layer on a surface of the cured product according to claim 15.

21. A board for an electronic material comprising the cured article according to claim 11.

\* \* \* \* \*